(12) United States Patent
Padiyath et al.

(10) Patent No.: US 10,723,102 B2
(45) Date of Patent: Jul. 28, 2020

(54) DURABLE LOW EMISSIVITY WINDOW FILM CONSTRUCTIONS

(71) Applicant: 3M INNOVATIVE PROPERTIES COMPANY, St. Paul, MN (US)

(72) Inventors: Raghunath Padiyath, Woodbury, MN (US); Stephen P. Maki, North St. Paul, MN (US); Robert R. Owings, Woodbury, MN (US); Gregory F. King, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 210 days.

(21) Appl. No.: 15/566,874

(22) PCT Filed: Apr. 18, 2016

(86) PCT No.: PCT/US2016/028027
§ 371 (c)(1),
(2) Date: Oct. 16, 2017

(87) PCT Pub. No.: WO2016/172015
PCT Pub. Date: Oct. 27, 2016

(65) Prior Publication Data
US 2018/0086024 A1    Mar. 29, 2018

Related U.S. Application Data

(60) Provisional application No. 62/149,926, filed on Apr. 20, 2015.

(51) Int. Cl.
*B32B 15/04*    (2006.01)
*E06B 9/24*    (2006.01)
(Continued)

(52) U.S. Cl.
CPC .............. *B32B 15/04* (2013.01); *B32B 7/12* (2013.01); *B32B 27/08* (2013.01); *B32B 27/16* (2013.01);
(Continued)

(58) Field of Classification Search
CPC ....... B32B 15/04; B32B 27/36; B32B 27/308; B32B 27/304; B32B 27/20; B32B 27/16;
(Continued)

(56) References Cited

U.S. PATENT DOCUMENTS 3,682,528 A    8/1972    Apfel
4,338,237 A    7/1982    Sulzbach
(Continued)

FOREIGN PATENT DOCUMENTS

WO    WO 1999-36248    7/1999
WO    WO 1999-36262    7/1999
(Continued)

OTHER PUBLICATIONS

International Search Report for PCT International Application No. PCT/US2016/028027, dated Jul. 15, 2016, 2 pages.

*Primary Examiner* — Nancy R Johnson
(74) *Attorney, Agent, or Firm* — Jeffrey M. Olofson

(57) ABSTRACT

In certain embodiments, the present disclosure relates to low emissivity films and articles comprising them. Other embodiments are directed to methods of reducing emissivity in an article comprising the use of low emissivity films. In some embodiments, the low emissivity films comprise a metal layer and one or more zirconium nitride layers adjacent the metal layer. This type of assembly may serve various purposes, including being used as a sun control film. These constructions may be used, for example, on glazing units for reducing transmission of infrared radiation across the film in both directions.

13 Claims, 1 Drawing Sheet

(51) Int. Cl.
  *C23C 14/06* (2006.01)
  *C08J 7/06* (2006.01)
  *C08J 7/18* (2006.01)
  *B32B 27/08* (2006.01)
  *B32B 27/16* (2006.01)
  *B32B 7/12* (2006.01)
  *B32B 27/20* (2006.01)
  *B32B 27/30* (2006.01)
  *B32B 27/36* (2006.01)

(52) U.S. Cl.
  CPC ............ *B32B 27/20* (2013.01); *B32B 27/304* (2013.01); *B32B 27/308* (2013.01); *B32B 27/36* (2013.01); *C08J 7/06* (2013.01); *C08J 7/18* (2013.01); *C23C 14/0676* (2013.01); *E06B 9/24* (2013.01); *B32B 2255/10* (2013.01); *B32B 2255/20* (2013.01); *B32B 2255/205* (2013.01); *B32B 2255/28* (2013.01); *B32B 2264/102* (2013.01); *B32B 2264/12* (2013.01); *B32B 2307/40* (2013.01); *B32B 2307/414* (2013.01); *B32B 2307/416* (2013.01); *B32B 2307/418* (2013.01); *B32B 2307/542* (2013.01); *B32B 2307/714* (2013.01); *B32B 2307/7265* (2013.01); *B32B 2307/732* (2013.01); *B32B 2309/105* (2013.01); *B32B 2419/00* (2013.01); *B32B 2605/006* (2013.01); *C08J 2367/02* (2013.01); *C08J 2433/08* (2013.01); *E06B 2009/2417* (2013.01)

(58) Field of Classification Search
  CPC ....... B32B 27/08; B32B 7/12; B32B 2255/10; B32B 2419/00; B32B 2309/105; B32B 2605/006; B32B 2307/732; B32B 2307/7265; B32B 2307/714; B32B 2307/542; B32B 2307/418; B32B 2307/416; B32B 2307/414; B32B 2307/40; B32B 2264/12; B32B 2264/102; B32B 2255/28; B32B 2255/205; B32B 2255/20; E06B 9/24; E06B 2009/2417; C08J 7/18; C08J 2433/08; C08J 2367/02; C23C 14/0676; C23C 28/00
  See application file for complete search history.

(56) References Cited

U.S. PATENT DOCUMENTS

| | | | |
|---|---|---|---|
| 4,799,745 | A | 1/1989 | Meyer |
| 5,188,887 | A | 2/1993 | Linge |
| 5,285,002 | A | 2/1994 | Grootaert |
| 5,302,449 | A | 4/1994 | Eby |
| 5,344,718 | A | 9/1994 | Hartig |
| 5,377,045 | A | 12/1994 | Wolfe |
| 5,514,476 | A | 5/1996 | Hartig |
| 6,034,813 | A * | 3/2000 | Woodard ............... B32B 17/10 359/360 |
| 6,059,909 | A | 5/2000 | Hartig |
| 6,852,419 | B2 | 2/2005 | Stachowiak |
| 6,881,487 | B2 | 4/2005 | Lin |
| 7,494,717 | B2 | 2/2009 | Decroupet |
| 8,293,344 | B2 | 10/2012 | Lemmer |
| 8,771,444 | B2 | 7/2014 | Van Nutt |
| 8,853,301 | B2 | 10/2014 | Jing |
| 2004/0096671 | A1 * | 5/2004 | Lin .................... C03C 17/3435 428/432 |
| 2005/0202254 | A1 | 9/2005 | Nunez-Regueiro |
| 2010/0160595 | A1 * | 6/2010 | Klun .................. C08G 18/3825 528/288 |
| 2013/0320241 | A1 | 12/2013 | Krasnov |
| 2013/0342899 | A1 * | 12/2013 | Van Nutt ............ B32B 17/1022 359/350 |
| 2014/0072784 | A1 | 3/2014 | Dietrich |
| 2014/0098414 | A1 | 4/2014 | Ohmori |
| 2014/0322527 | A1 | 10/2014 | Cho |
| 2015/0007935 | A1 | 1/2015 | Fujisawa |
| 2015/0022879 | A1 | 1/2015 | Kawasaki |
| 2016/0003989 | A1 | 1/2016 | Watanabe |
| 2016/0047958 | A1 | 2/2016 | Fujisawa |

FOREIGN PATENT DOCUMENTS

| | | | |
|---|---|---|---|
| WO | WO 2009-085741 | 7/2009 | |
| WO | WO-2013119734 A1 * | 8/2013 | ........... H01L 31/048 |

* cited by examiner

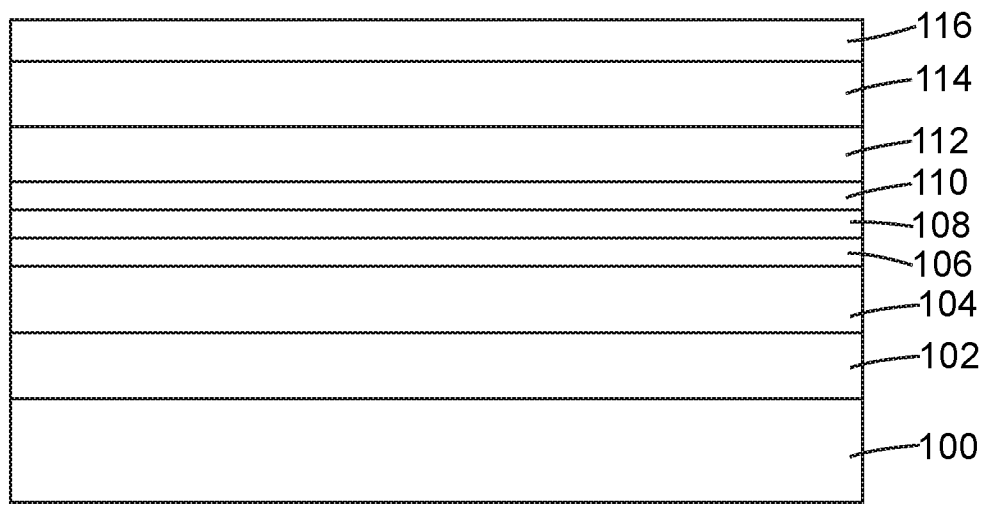

DURABLE LOW EMISSIVITY WINDOW FILM CONSTRUCTIONS

In certain embodiments, the present disclosure relates to low emissivity films and articles comprising them. Other embodiments are directed to methods of reducing emissivity in an article comprising the use of low emissivity films. In some embodiments, the low emissivity films comprise a metal layer and one or more zirconium nitride layers adjacent the metal layer. This type of assembly may serve various purposes, including being used as a sun control film. These constructions may be used, for example, on glazing units for reducing transmission of infrared radiation across the film in both directions.

BACKGROUND

A variety of approaches are used to reduce energy consumption in commercial or residential buildings, as well as in the automotive industry to help maintain a comfortable temperature in the passenger cabin with minimum energy expenditure. For example, dyed and vacuum-coated plastic films have been applied to windows to reduce heat load due to sunlight. Typically, heat load reduction is accomplished by blocking solar radiation in the visible or the infrared portions of the solar spectrum, or both (i.e., at wavelengths ranging from 400 nm to 2500 nm or greater).

In general, dyed films can control the transmission of visible light, primarily through absorption, and consequently also provide glare reduction. However, dyed films generally do not block near-infrared solar energy and are not completely effective as solar control films. Dyed films also often fade with solar exposure. In addition, when films are colored with multiple dyes, the dyes may fade at different rates, causing unwanted color changes over the life of the film.

Other known window films for solar control include those fabricated using vacuum-deposited grey metals (e.g., stainless steel, inconel, monel, chrome, and nichrome alloys, among others). The deposited grey metal films offer about the same degree of transmission in the visible and infrared portions of the solar spectrum. As a result, in general, the grey metal films are an improvement over dyed films with regard to solar control. The grey metal films are relatively stable when exposed to light, oxygen, or moisture, and in those cases in which the transmission of the coatings increases due to oxidation, color changes may not be generally detectable. After application to clear glass, grey metals block light transmission by approximately equal amounts of solar reflection and absorption. While the use of grey metal for solar control window films is quite common, metals such as copper or sometimes even ceramic materials such as titanium nitride is used.

Other window films for solar control include those with vacuum-deposited layers of certain metals, such as silver, aluminum, and copper, which control solar radiation primarily by reflection. Certain thin metal films may remain semi-transparent in the visible spectrum and reflect near infrared radiation are used in solar control glazing applications. Most often, silver or silver alloys is the choice of metal due to its high reflectance in the infrared region. However, window films having a metal layer of a sufficient thicknesses to achieve a high level of near infrared reflection may also have significant reflection in the visible region. Under certain circumstances, the reflection of thin metal layers in the visible region could be suppressed by cladding the silver layer on both sides with a high refractive index dielectric layer having a metal oxide with a sufficiently large thickness. The combination of refractive index and thickness (optical thickness) of these layers can be chosen in order to achieve high visible transmission and low reflection.

There is a continuing need for high visible light transmission (e.g., >70%) and low emissivity (e.g., less than 0.2) films. The present disclosure describes novel durable low emissivity films that could be used as solar control films, and which have low visible reflectance and high visible transmission.

SUMMARY

The present disclosure is directed generally to films designed to manage heat gain and loss across glazing units. Certain embodiments of these films have high visible light transmission and low visible light reflectance and comprise both: a) means for rejecting the infrared and ultraviolet portions of the incident solar radiation in order to reduce solar heat gain and b) means for reflecting the infrared back into the room to reduce heat loss.

In certain embodiments, reflection of infrared radiation by the film is accomplished in part by having a metal layer sandwiched between two layers each comprising zirconium nitride. In some embodiments, the thickness of each of the layers comprising zirconium nitride is, independent from each other, from 1 nm to 15 mn. In other embodiments, the layer comprising zirconium nitride onto which the metal layer is deposited can be replaced by a layer comprising other metal oxides, such as aluminum zinc oxide. In other embodiments, an additional "nucleation layer" (sometimes also called a "precoat layer," or a "contact layer") is present, onto which the metal layer can be deposited.

In certain embodiments, the thickness of the two layers comprising zirconium nitride is less than 10 nm. In other embodiments, the film has an emissivity of less than 0.2, a visible reflectance of less than 25%; and a visible transmission greater than 50%. In other embodiments, the film has a neutral color.

All scientific and technical terms used herein have meanings commonly used in the art unless otherwise specified. The definitions provided herein are to facilitate understanding of certain terms used frequently in this application and are not meant to exclude a reasonable interpretation of those terms in the context of the present disclosure.

Unless otherwise indicated, all numbers in the description and the claims expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The recitation of numerical ranges by endpoints includes all numbers subsumed within that range (e.g. a range from 1 to 5 includes, for instance, 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The term "polymer" will be understood to include polymers, copolymers (e.g., polymers formed using two or more different monomers), oligomers and combinations thereof, as well as polymers, oligomers, or copolymers that can be formed in a miscible blend. Polymers referred to in this invention include those polymerized in-situ from monomers as well as those materials that exist in a polymeric form independent of the processes used to create them herein.

The term "adjacent" refers to the relative position of two elements, such as, for example, two layers, that are close to each other and may or may not be necessarily in contact with each other or that may have one or more layers separating the two elements as understood by the context in which "adjacent" appears.

The term "immediately adjacent" refers to the relative position of two elements, such as, for example, two layers, that are next to each other and in contact with each other and have no intermediate layers separating the two elements.

The term "outermost layer" refers to the layer in a film that is only in contact with one of the layer of the film and that is furthest away from the substrate layer. The outermost layer is not the adhesive layer that is intended to be in contact with the glazing unit, nor is it the liner that may be protecting the adhesive layer. For example, with respect to the construction in FIG. 1, layer 8 is the outermost layer. With respect to Examples 1 and 2, layer 8 is also the outermost layer in each case. However, with respect to Examples 3 and 4, layer 7 is the outermost layer. In some embodiments, the outermost layer is a protective layer.

The term "optically clear" as used herein refers to an article (e.g., a film) that has a luminous transmittance of between 3 and 80 percent and that exhibits a haze value lower than 10% in the 400 nm to 700 nm wavelength range. Both the luminous transmission and the total haze can be determined using, for example, a BYK Gardner Haze-gard Plus (Catalog No. 4725) according to the method of ASTM-D 1003-13, Procedure A (Hazemeter). Where total haze is the percent of total transmitted light which, in passing through the film specimen deviated from the incident beam through forward scatter by more than 0.044 radians (2.5 degrees) on average.

The term "adhesive" as used herein refers to polymeric compositions useful to adhere together two components (adherents). Examples of adhesives include heat activated adhesives and pressure sensitive adhesives.

The term "haze" as used herein refers to the percentage of transmitted light that deviates from the incident beam by more than 2.5° from the normal incident beam when passing through a material. As mentioned above, haze can be determined using, for example, the method of ASTM-D 1003-13.

The term "construction" or "assembly" are used interchangeably in this application when referring to a multilayer film, in which the different layers can be coextruded, laminated, coated one over another, or any combination thereof.

The term "film" as used herein refers, depending on the context, to either a single layer article or to a multilayer construction, where the different layers may have been laminated, extruded, coated, or any combination thereof.

The term "visible light" or "visible spectrum" as used herein refers to refers to radiation in the visible spectrum, which in this disclosure is taken to be from 400 nm to 700 nm.

The term "near infrared spectrum" or simply "infrared spectrum" as used herein refers to radiation in the in the range from 700 nm to 2500 nm.

The term "emissivity" as used herein is a measure of the efficiency that a surface emits thermal energy and is defined as the ratio of the radiation emitted by a surface to the radiation emitted by a perfect black body at the same temperature. The emissivity is a value between 0 and 1 and is measured according to ASTM C1371. One such instrument for measuring emissivity is available (model AE1 emissometer) from Devices and Services Company, Dallas, Tex.

The term "radiation-cured" in the context of curing a polymer refers to curing aided by the use of any type of electromagnetic radiation, including, for example, actinic radiation (radiation that is capable of producing photochemical reactions, such as ultraviolet radiation, vacuum UV (VUV), extreme UV (EUV or XUV) or in some cases even visible light, electron beam, or UV radiation generated from plasma such as that used in a sputtering process, for example.

The term "visible light reflectance" as used herein refers to the percentage of solar energy in the visible spectrum that is reflected by a surface with respect to the total energy in the visible spectrum that reaches that surface. The visible light reflectance is a value between 0 and 100% and is measured according to ASTM E903 in a Perkin Elmer Lambda 1050 spectrophotometer.

The term "visible light transmission" as used herein refers to the percentage of solar energy in the visible spectrum that is transmitted across a surface. The visible light transmission is a value between 0 and 100% and is measured according to ASTM E903 in a Perkin Elmer Lambda 1050 spectrophotometer.

The term "substantially color neutral" as used herein refers to an article having a CIE L*a*b* color coordinates for a* from −10 to +10 and for b* from −10 to +10. a* and b* are measured using illuminant D65 in a colorimeter device such as Ultrascan PRO, available from Hunter Associates Laboratory, VA.

The term "dielectric layer" as used herein refers to a layer that comprises a dielectric material. A dielectric material refers to a material that is less conductive than metallic conductors. Examples of suitable dielectric materials include semiconducting materials, insulators, and certain metal oxide materials (e.g., aluminum zinc oxide and indium tin oxide).

The term "substrate" or "substrate layer" as used herein refers to the material or surface on which another material or layer may be deposited.

The term "resistant to condensed water" as used herein refers to the absence of delamination in the film after 100 hours of exposure to condense water as described in the Examples section.

The term "resistant to dilute acetic acid" as used herein refers to a change in color as measured by $\Delta E_{ab}^*$ of less than or equal 3 when the film is exposed to acetic acid as described in the Examples section. $\Delta E_{ab}^*$ is measured using the CIE L*a*b* color system using illuminant D65 in a colorimeter device such as a HunterLab UltraScan PRO (SN USP1828). Where $\Delta E_{ab}^*$ is defined as:

$$\Delta E_{ab}^* = [(\Delta L^*)^2 + (\Delta a^*)^2 + (\Delta b^*)^2]^{1/2}$$

□E$_{ab}$* defines the total color difference between a film exposed to dilute acetic acid as described in the Examples section and the initial, non-treated sample.

The term "resistant to scratching by steel wool" as used herein refers to obtaining no scratches after exposing the film to scratching with steel wool as described in the Examples section.

BRIEF DESCRIPTION OF THE DRAWINGS

FIG. 1 shows an embodiment of a low emissivity film of the present disclosure. Layer 100 refers to the substrate. Layer 102 refers to a radiation-cured acrylate layer (e.g., in certain embodiments, it is the second-radiation-cured acrylate layer recited in the claims). Layer 104 refers to a layer comprising a silicon compound (e.g., in certain embodiments, it is the second layer comprising a silicon compound recited in the claims). Layer 106 refers to a substrate layer for the metal layer (e.g., in certain embodiments, it is the second layer comprising a zirconium nitride recited in the claims, or in other embodiments, it is the substrate layer for the metal layer recited in other claims). Layer 108 refers to a metal layer. Layer 110 refers to a layer comprising zirconium nitride (e.g., in certain embodiments, it is the first layer comprising a zirconium nitride recited in the claims). Layer 112 refers to a radiation-cured acrylate layer (e.g., in certain embodiments, it is the first radiation-cured acrylate layer recited in the claims). Layer 114 refers to a layer comprising a silicon compound (e.g., in certain embodiments, it is the first layer comprising a silicon compound recited in the claims). In some embodiments, those that do not comprise layer 116, layer 114 is the outermost layer of the assembly. Layer 116 refers to a radiation-cured acrylate layer. In embodiments where layer 116 is present, layer 116 is the outermost layer of the construction (e.g., it is the "outermost layer" recited in the claims and comprises the "third radiation-cured acrylate layer"). In some embodiments, the outermost layer is a protective layer.

In the following description, reference is made to the accompanying drawing. In certain cases, each Figures may depict, by way of illustration, one or more specific embodiments of the present disclosure. It is to be understood that other embodiments different from those explicitly depicted in the Figures are contemplated and may be made without departing from the scope or spirit of the present disclosure. The following detailed description, therefore, is not to be taken in a limiting sense.

DETAILED DESCRIPTION

In one embodiment, the films of this disclosure are low emissivity films. In another embodiment, the present disclosure is directed to a film comprising: a) a first layer comprising zirconium nitride, b) a metal layer immediately adjacent the first layer comprising zirconium nitride, c) a substrate layer for the metal layer comprising a compound chosen from zirconium nitride, aluminum zinc oxide (AZO), zinc tin oxide, tin oxide, and zinc oxide, wherein the substrate layer for the metal layer is immediately adjacent the metal layer, and d) a substrate immediately adjacent the substrate layer for the metal layer; wherein the film has an emissivity of less than 0.2, a visible reflectance of less than 25%; and a visible transmission greater than 50%. In some embodiments, the substrate layer for the metal layer is a second layer comprising zirconium nitride.

In some embodiments, the film further comprises a first radiation-cured acrylate layer adjacent the first layer comprising zirconium nitride. In other embodiments, the film further comprises a first layer comprising a silicon compound adjacent the first radiation-cured acrylate layer, wherein the silicon compound is chosen from silicon aluminum oxide, silicon aluminum oxynitride; silicon oxide, silicon oxynitride, silicon nitride, silicon aluminum nitride and combinations thereof. In certain embodiments, this first layer comprising a silicon compound is the outermost layer of the film.

In other embodiments, the film further comprises a dielectric layer adjacent the substrate layer for the metal layer. In certain embodiments, the dielectric layer is a second layer comprising a silicon compound, wherein the silicon compound is chosen from silicon aluminum oxide, silicon aluminum oxynitride; silicon oxide, silicon oxynitride, silicon nitride, silicon aluminum nitride and combinations thereof.

In other embodiments, the film further comprises a second radiation-cured acrylate layer adjacent the second layer comprising a silicon compound and also adjacent to the substrate.

In other embodiments, the film further comprises a layer comprising a pressure sensitive adhesive immediately adjacent to the substrate and further comprises a liner immediately adjacent to the layer comprising a pressure sensitive adhesive.

In other embodiments, the film comprises the following layers in the recited order:
  a first layer comprising a silicon compound, wherein the silicon compound is chosen from silicon aluminum oxide, and silicon aluminum oxynitride; silicon oxide, silicon oxynitride, silicon nitride, silicon aluminum nitride, and combinations thereof,
  a first radiation-cured acrylate layer;
  a first layer comprising zirconium nitride, wherein the layer has a thickness from 1 to 6 15 nm;
  a metal layer,
  a second layer comprising zirconium nitride, wherein the layer has a thickness from 1 to 6 15 nm;
  a second layer comprising a silicon compound, wherein the silicon compound is chosen from silicon aluminum oxide and, silicon aluminum oxynitride, silicon oxide, silicon oxynitride silicon nitride, silicon aluminum nitride, and combinations thereof,
  a second radiation-cured acrylate layer;
  a substrate;
  wherein the film has an emissivity of less than 0.2, wherein the film has a visible reflectance of less than 25%; and wherein the film has a visible transmission greater than 50%.

The characteristics of the different layers that can be part of the films described herein will be described in detailed below. For simplicity, the layers in the films described in this disclosure have been named using a brief description of the component(s) present in that layer. When two or more layers have similar components, the first layer that appears in the construction (starting from the outermost layer and going in the direction towards the substrate) will include the qualifier "first" in its name, followed by a description of the layer. For example, the first layer that comprises a silicon compound and that is closest to the outermost layer is named "first layer comprising a silicon compound." The next layer having a silicon compound would be called the "second layer comprising a silicon compound" (i.e. the layer comprising a silicon compound that is closest to the substrate). In order to avoid confusion, the layers will retain the label "first" or "second" in a given assembly even if one of the other layers is not present. For example, it is possible to have a film with a "second layer comprising a silicon compound" even if the film does not have a "first layer comprising a silicon compound." As mentioned above, the outermost layer is understood to be the layer that is the farthest from the surface of the substrate that is opposite to the surface of the substrate that could be bonded to a glazing unit (e.g., via a pressure sensitive adhesive).

First Layer Comprising a Silicon Compound

The first layer comprising a silicon compound is optional. As used herein the first layer comprising a silicon compound refers to a layer comprising silicon that has been deposited under a reduced pressure process (less than 1 atm) and does not refer to layers comprising silicon as part of silica nanoparticles. In certain embodiments, the silicon compound in this layer is chosen from silicon aluminum oxide, silicon aluminum oxynitride; silicon oxide, silicon oxynitride, silicon nitride, silicon aluminum nitride, and combinations thereof.

In some embodiments, the silicon compound in this layer is silicon aluminum oxynitride. In other embodiments, when the silicon compound is silicon aluminum oxynitride, the ratio of oxygen to nitrogen in the silicon aluminum oxynitride is from 0.1 to 1, or from 0.3 to 0.5, or 0.4. In other embodiments, when the first layer comprising a silicon compound comprises silicon oxide, the silicon to oxygen ratio is from 0.4 to 1.0, or from 0.4 to 0.8, or 0.5.

In other embodiments, when the first layer comprising a silicon compound comprises silicon aluminum oxide, the silicon to aluminum ratio is greater than 8, or from 8 to 10, or 9.

In some embodiments, the first layer comprising a silicon compound is deposited on the first radiation-cured acrylate layer. Deposition of the first layer comprising a silicon compound can be accomplished by any means known in the art to deposit inorganic oxides. For example, in some embodiments, deposition occurs by sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof, under suitable gaseous atmospheres.

In certain embodiments, the silicon is sputter-deposited using a silicon target (or in other embodiments, a silicon-aluminum target) under a suitable atmosphere. In one embodiment, a target consisting of 90% silicon and 10% aluminum is used. In some embodiments, an oxygen atmosphere, or a nitrogen atmosphere is used, while in other embodiments, a mixture of oxygen and nitrogen are used.

In other embodiments, the first layer comprising a silicon compound has a thickness from 10 nm to 30 nm, or from 20 nm to 30 nm, or 25 nm.

In some embodiments, the silicon compound in the first layer comprising a silicon compound is surface modified to impart hydrophobicity, for example by the use of a fluorosilane coating. One such composition can be obtained by the use of Fluorolink® S10 silane functionalized perfluoro polyether (PFPE) available from SOLVAY SOLEXIS S.p.A., Italy. In other embodiments, the silicon compound in the first layer comprising a silicon compound is surface modified to impart hydrophilicity, for example, by the use of an acid functionalized coating. One suitable composition is described in U.S. Pat. No. 8,853,301, incorporated herein by reference for its disclosure of processes for imparting hydrophillicity and the resulting surface-modified materials.

In certain embodiments, the first layer comprising a silicon compound is the outermost layer. However, in other embodiments, a third radiation-cured acrylate layer is coated on the first layer comprising a silicon compound and, thus, the third radiation-cured acrylate layer is the outermost layer in those embodiments. In other embodiments, the first layer comprising a silicon compound may be adjacent (and in some embodiments, immediately adjacent) the first radiation-cured acrylate layer. In other embodiments, the first layer comprising a silicon compound is between the outermost layer comprising a third radiation-cured acrylic polymer and the first radiation-cured acrylate layer.

In certain embodiments, the location of the first layer comprising a silicon compound can be swapped with the location of the first radiation-cured acrylate layer. For example, in some embodiments, the first layer comprising a silicon compound can be deposited on the first layer comprising zirconium nitride and subsequently the first radiation-cured acrylate layer can be deposited on the first layer comprising a silicon compound. That is, in such a construction, the first layer comprising a silicon compound is between (either adjacent or immediately adjacent) the first layer comprising zirconium nitride and the first radiation-cured acrylate layer.

In some embodiments, first layer comprising a silicon compound can be replaced by a third radiation-cured acrylate layer.

First Radiation-Cured Acrylate Layer

The first radiation-cured acrylate layer is optional. In some embodiments, the first radiation-cured acrylate layer comprises a blend of one or more acrylate polymers. As used herein, acrylate polymers include acrylates, methacrylates, and their copolymers. Acrylate polymers as used herein also include functionalized versions of acrylates, methacrylates, and their copolymers, which can be used alone or in combination with other multifunctional or monofunctional (meth)acrylates. Examples of suitable acrylate polymers also include polyacrylates, polymethacrylates, such as poly (methyl methacrylate) (PMMA), either as homopolymers or copolymers.

Examples of functionalized acrylate monomers include phenylthioethyl acrylate, hexanediol diacrylate, ethoxyethyl acrylate, phenoxyethyl acrylate, cyanoethyl (mono) acrylate, isobornyl acrylate, isobornyl methacrylate, octadecyl acrylate, isodecyl acrylate, lauryl acrylate, ~carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, 2-biphenyl acrylate, tris(2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N.J.), CN120E50 and CN120C60 (both available from Sartomer, Exton, Pa.), and mixtures thereof.

In certain embodiments, the acrylate polymers include blends comprising tricyclodecane dimethanol diacrylate and an acidic acrylic oligomer, such as CN147 or SR 9051, from Arkema, Inc. In other embodiments, the first radiation-cured acrylate layer further comprises an acid functionalized monomer, such as, for example, an acid-modified epoxy acrylate, such as KRM 8762, from Daicel-Allnex. In yet other embodiments the first radiation-cured acrylate further comprises additives for improving adhesion to the substrate layer for the first acrylate layer. One such example is the use of functional silane compounds available under the brand name Dynasilan®.

In some embodiments, the first radiation-cured acrylate layer is crosslinked in situ atop the previously deposited layer. In certain embodiments, the first radiation-cured acrylate layer can be formed by flash evaporation or vapor deposition followed by crosslinking. In some embodiments, the first radiation-cured acrylate layer can be applied using other conventional coating methods such as roll coating, (e.g., gravure roll coating) die coating or spray coating (e.g., electrostatic spray coating).

In some embodiments, the first radiation-cured acrylate layer comprises more than one radiation-cured acrylate layer, with each of the radiation-cured acrylate layers having a refractive index from 1.45 to 1.55.

In some embodiments, the first radiation-cured acrylate layer is flash-evaporated and condensed on the first layer comprising zirconium nitride. In certain embodiments, the first radiation-cured acrylate layer has a thickness from 20 nm to 100 nm. In other embodiments, the first radiation-cured acrylate layer is deposited on the first layer comprising a silicon compound, which has been deposited on the first layer comprising zirconium nitride. Thus, in certain embodiments, the first radiation-cured acrylate layer can be the outermost layer of the film and be adjacent (or immediately adjacent) the first layer comprising a silicon compound. In other embodiments, the first radiation-cured acrylate layer can be deposited on the first layer comprising a silicon compound (as mentioned above), and serve as the substrate for the outermost layer comprising a third radiation-cured acrylate layer. Thus, in those embodiments, the first radiation-cured acrylate layer is between the third radiation-cured acrylate layer (outermost layer) and the first layer comprising a silicon compound.

In certain embodiments, when the first radiation-cured acrylate layer is the outermost layer, then the first radiation-cured acrylate layer may comprise a fluoropolymer. Examples of suitable fluoropolymers are described below in a separate section. In other embodiments, the first radiation-cured acrylate layer can be replaced by a dielectric layer.

As mentioned before, a radiation-cured layer refers to a layer in which curing is aided by the use of any type of electromagnetic radiation, including, for example, actinic radiation, electron beam, and plasma radiation. In certain embodiments, the radiation-cured layer is cured by exposure to electron beam radiation or ultraviolet radiation.

In some embodiments, the first radiation-cured acrylate layer is adjacent the first layer comprising zirconium nitride. In other embodiments, the first radiation-cured acrylate layer is immediately adjacent the first layer comprising zirconium nitride.

In certain embodiments, in addition to being adjacent the first layer comprising zirconium nitride, the first radiation-cured acrylate layer is also adjacent the first layer comprising a silicon compound. In other embodiments, in addition to being immediately adjacent the first layer comprising zirconium nitride, the first radiation-cured acrylate layer is also immediately adjacent the first layer comprising a silicon compound. That is, in some embodiments, the first radiation-cured acrylate layer is between the first layer comprising a silicon compound and the first layer comprising zirconium nitride.

First Layer Comprising Zirconium Nitride

In some embodiments, the first layer comprising zirconium nitride can be formed using various deposition techniques with a zirconium target under a nitrogen atmosphere, such as sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof.

In some embodiments, the first layer comprising zirconium nitride is deposited over the metal layer using a reactive magnetron sputtering process using a zirconium sputtering target under a nitrogen atmosphere. Typically, the deposition process continues for a sufficient duration to build up a suitable layer thickness as needed. In a roll-to-roll process, the substrate transport speed and sputtering rate is adjusted to achieve the desired thickness.

In some embodiments, the thickness of the first layer comprising zirconium nitride is less than 30 nm, or less than 25 nm, or less than 20 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm, or less than 4 nm, or less than 3 nm. In other embodiments, the thickness of the first layer comprising zirconium nitride is from 1 to 30 nm, or from 1 to 25 nm, or from 1 to 20 nm, or from 1 to 15 nm, or from 1 to 14 nm, or from 1 to 13 nm, or from 1 to 12 nm, or from 1 to 11 nm, or from 1 to 10 nm, or from 1 to 9 nm, or from 1 to 8 nm, or from 1 to 7 nm, or from 1 to 6 nm, or from 1 to 5 nm, or from 1 to 4 nm, or from 2 to 4 nm, or 3 nm.

In some embodiments, the first layer comprising zirconium nitride further comprises oxygen and the ratio of oxygen to nitrogen in the zirconium oxynitride is from 0 to 1.

Without wishing to be bound by theory, the inventors have discovered that in some embodiments, the thickness of the first layer comprising zirconium nitride is significantly smaller than the thickness normally associated with typical dielectric layers surrounding a metal layer.

In some embodiments, the first layer comprising zirconium nitride is adjacent the metal layer. In other embodiments, the first layer comprising zirconium nitride is immediately adjacent the metal layer.

In certain embodiments, in addition to being adjacent the metal layer, the first layer comprising zirconium nitride is also adjacent the first radiation-cured acrylate layer. In other embodiments, in addition to being adjacent the metal layer, the first layer comprising zirconium nitride is also immediately adjacent the first radiation-cured acrylate layer. That is, in some embodiments, the first layer comprising zirconium nitride is between the metal layer and the first radiation-cured acrylate layer.

Metal Layer

In some embodiments, the metal layer comprises one or more metallic component chosen from: silver, gold, copper, nickel, iron, cobalt, zinc, and alloys of one or more metal chosen from gold, copper, nickel, iron, cobalt, and zinc. In other embodiments, the metal layer comprises a silver alloy, including silver alloys comprising 80% or more silver, such as 85% silver. In one embodiment, the metal layer comprises a silver-gold alloy.

The metal layer can be deposited using the same techniques described above for the first layer comprising zirconium nitride. In some embodiments, the metal layer is deposited using physical vapor deposition (PVD) techniques. Typically, in a PVD technique, atoms of the target are ejected by high-energy particle bombardment so that they can impinge onto a suitable substrate (such as the second layer comprising zirconium nitride) to form a thin film. The high-energy particles used in sputter-deposition are generated by a glow discharge, or a self-sustaining plasma created by applying, for example, an electromagnetic field to argon gas.

In other embodiments, the metal layer is deposited on the second layer comprising zirconium nitride using a magnetron sputtering process with an alloy target having approximately 85% silver and 15% gold.

In some embodiments, the thickness of the metal layer is less than 30 nm, or less than 20 nm, or less than 15 nm, or less than 14 nm, or less than 13 nm, or less than 12 nm, or less than 11 nm, or less than 10 nm, or less than 9 nm, or less than 8 nm, or less than 7 nm, that thickness can depend on the efficacy of the substrate layer. In other embodiments, the thickness of the first layer comprising zirconium nitride is from 1 to 30 nm, or from 5 to 25 nm, or from 5 to 20 nm, or from 5 to 15 nm, or from 5 to 14 nm, or from 5 to 13 nm, or from 5 to 12 nm, or from 5 to 11 nm, or from 5 to 10 nm, or from 8 to 15 nm, or from 8 to 14 nm, or from 10 nm to 12 nm.

In some embodiments, the metal layer is adjacent the second layer comprising zirconium nitride. In other embodiments, the metal layer is immediately adjacent the second layer comprising zirconium nitride.

In certain embodiments, in addition to being adjacent the second layer comprising zirconium nitride, the metal layer is also adjacent the first layer comprising zirconium nitride. In other embodiments, in addition to being adjacent the second layer comprising zirconium nitride, the metal layer is also immediately adjacent the first layer comprising zirconium nitride. That is, in some embodiments, the metal layer between the first layer comprising zirconium nitride and the second layer comprising zirconium nitride.

Second Layer Comprising Zirconium Nitride

In some embodiments, the second layer comprising zirconium nitride can be formed using various deposition techniques with a zirconium target under a nitrogen atmosphere, such as sputtering (e.g., reactive sputtering, for example planar or rotary magnetron sputtering), evaporation (e.g., thermal, resistive, or electron beam evaporation), various chemical vapor depositions, ion-assisted e-beam evaporation, and variations thereof.

In some embodiments, the second layer comprising zirconium nitride is deposited over the metal layer using a reactive magnetron sputtering process using a zirconium sputtering target under a nitrogen atmosphere. Typically, the deposition process continues for a sufficient duration to build up a suitable layer thickness as needed.

In some embodiments, the thickness of the second layer comprising zirconium nitride is less than 30 nm, or less than 25 nm, or less than 20 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm, or less than 4 nm, or less than 3 nm. In other embodiments, the thickness of the second layer comprising zirconium nitride is from 1 to 30 nm, or from 1 to 25 nm, or from 1 to 20 nm, or from 1 to 15 nm, or from 1 to 14 nm, or from 1 to 13 nm, or from 1 to 12 nm, or from 1 to 11 nm, or from 1 to 10 nm, or from 1 to 9 nm, or from 1 to 8 nm, or from 1 to 7 nm, or from 1 to 6 nm, or from 1 to 5 nm, or from 1 to 4 nm, or from 2 to 4 nm, or 3 nm.

In some embodiments, the second layer comprising zirconium nitride further comprises oxygen and the ratio of oxygen to nitrogen in the zirconium oxynitride is from 0 to 1.

Without wishing to be bound by theory, the inventors have discovered that in some embodiments, the thickness of the second layer comprising zirconium nitride is significantly smaller than the thickness normally associated with typical dielectric layers surrounding a metal layer.

In some embodiments, the second layer comprising zirconium nitride is adjacent the second layer comprising a silicon compound. In other embodiments, the second layer comprising zirconium nitride is immediately adjacent the second layer comprising a silicon compound.

In certain embodiments, in addition to being adjacent the second layer comprising a silicon compound, the second layer comprising zirconium nitride is also adjacent the metal layer. In other embodiments, in addition to being adjacent the second layer comprising a silicon compound, the second layer comprising zirconium nitride is also immediately adjacent the metal layer. That is, in some embodiments, the second layer comprising zirconium nitride is between the metal layer and the second layer comprising a silicon compound.

Substrate Layer for Metal Layer

In some embodiments, the substrate layer for the metal layer is the second layer comprising zirconium nitride. In other embodiments, the substrate layer for the metal layer is a layer comprising an oxide chosen from aluminum zinc oxide, tin oxide, and zinc tin oxide. Deposition of the metal oxide in this layer can be accomplished by the same methods described above for the second layer comprising zirconium nitride.

In some embodiments, the substrate layer for the metal layer is adjacent the second layer comprising a silicon compound. In other embodiments, the substrate layer for the metal layer is immediately adjacent the second layer comprising a silicon compound.

In certain embodiments, in addition to being adjacent the second layer comprising a silicon compound, the substrate layer for the metal layer is also adjacent the metal layer. In other embodiments, in addition to being adjacent the second layer comprising a silicon compound, the substrate layer for the metal layer is also immediately adjacent the metal layer. That is, in some embodiments, the substrate layer for the metal layer is between the metal layer and the second layer comprising a silicon compound.

Second Layer Comprising a Silicon Compound

In certain embodiments, the silicon compound in this layer is chosen from silicon aluminum oxide, silicon aluminum oxynitride; silicon oxide, silicon oxynitride, silicon nitride, silicon aluminum nitride and combinations thereof.

In some embodiments, the silicon compound in this layer is silicon aluminum oxynitride. In other embodiments, when the silicon compound is silicon aluminum oxynitride, the ratio of oxygen to nitrogen in the silicon aluminum oxynitride is from 0.1 to 1, or from 0.3 to 0.5, or 0.4. In other embodiments, when the second layer comprising a silicon compound comprises silicon oxide, the silicon to oxygen ratio is from 0.4 to 1.0, or from 0.4 to 0.8, or 0.5.

In other embodiments, when the second layer comprising a silicon compound comprises silicon aluminum oxide, the silicon to aluminum ratio is greater than 8, or from 8 to 10, or 9.

In some embodiments, the second layer comprising a silicon compound is deposited on the second radiation-cured acrylate layer. As mentioned before, deposition of this layer can be accomplished by any means known in the art to deposit inorganic oxides. For example, in some embodiments, deposition occurs by sputtering (e.g., reactive sputtering, for example planar or rotary magnetron sputtering), evaporation (e. g., thermal, resistive, or electron beam evaporation), various chemical vapor depositions, ion-assisted e-beam evaporation, and variations thereof, under suitable gaseous atmospheres.

In certain embodiments, the silicon is sputter-deposited using a silicon target (or in other embodiments, a silicon-aluminum target) under a suitable atmosphere. In one embodiment, a target consisting of 90% silicon and 10% aluminum is used. In some embodiments, an oxygen atmosphere, or a nitrogen atmosphere is used, while in other embodiments, a mixture of oxygen and nitrogen are used.

In other embodiments, the second layer comprising a silicon compound has a thickness from 10 nm to 30 nm, or from 15 nm to 25 nm, or 20 nm.

In some embodiments, the silicon compound in the second layer comprising a silicon compound is surface modified to impart hydrophobicity, for example by the use of a fluorosilane coating. One such composition can be obtained by the use of Fluorolink® S10 silane functionalized perfluoro polyether (PFPE) available from SOLVAY SOLEXIS S.p.A., Italy. In other embodiments, the silicon compound in the first layer comprising a silicon compound is surface modified to impart hydrophilicity, for example, by the use of an acid functionalized coating. One suitable composition is described in U.S. Pat. No. 8,853,301, incorporated herein by reference for its disclosure of processes for imparting hydrophillicity and the resulting surface-modified materials.

In some embodiments, the second layer comprising a silicon compound may be present in the low emissivity film, even if the first layer comprising a silicon compound is not present. In some embodiments, the second layer comprising a silicon compound is adjacent the second radiation-cured acrylate layer. In other embodiments, the second layer comprising a silicon compound is immediately adjacent the second radiation-cured acrylate layer.

In certain embodiments, in addition to being adjacent the second radiation-cured acrylate layer, the second layer comprising a silicon compound is also adjacent the second layer comprising zirconium nitride. In other embodiments, in addition to being adjacent the second radiation-cured acrylate layer, the second layer comprising a silicon compound is also immediately adjacent the second layer comprising zirconium nitride. That is, in some embodiments, the second layer comprising a silicon compound is between the second radiation-cured acrylate layer and the second layer comprising zirconium nitride.

Second Radiation-Cured Acrylate Layer

In some embodiments, the first radiation-cured acrylate layer comprises a blend of one or more acrylate polymers. As used herein, acrylate polymers include acrylates, methacrylates, and their copolymers. Acrylate polymers as used herein also include functionalized versions of acrylates, methacrylates, and their copolymers, which can be used alone or in combination with other multifunctional or monofunctional (meth)acrylates. Examples of suitable acrylate polymers also include polyacrylates, polymethacrylates, such as poly (methyl methacrylate) (PMMA), either as homopolymers or copolymers.

Examples of functionalized acrylate monomers include phenylthioethyl acrylate, hexanediol diacrylate, ethoxyethyl acrylate, phenoxyethyl acrylate, cyanoethyl (mono) acrylate, isobornyl acrylate, isobornyl methacrylate, octadecyl acrylate, isodecyl acrylate, lauryl acrylate, ~carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, 2-biphenyl acrylate, tris(2-hydroxyethyl)-isocyanurate triacrylate, pentaerythritol triacrylate, phenylthioethyl acrylate, naphthloxyethyl acrylate, EBECRYL 130 cyclic diacrylate (available from Cytec Surface Specialties, West Paterson, N.J.), epoxy acrylate RDX80095 (available from Rad-Cure Corporation, Fairfield, N.J.), CN120E50 and CN120C60 (both available from Sartomer, Exton, Pa.), and mixtures thereof.

In certain embodiments, the acrylate polymers include blends comprising tricyclodecane dimethanol diacrylate and an acidic acrylic oligomer, such as CN147, from Arkema, Inc. In other embodiments, the second radiation-cured acrylate layer further comprises an acid functionalized monomer, such as, for example, an acid-modified epoxy acrylate, such as KRM 8762, from Daicel-Allnex.

In some embodiments, the second radiation-cured acrylate layer is crosslinked in situ atop the previously deposited layer. In certain embodiments, the second radiation-cured acrylate layer can be formed by flash evaporation or vapor deposition followed by crosslinking. In some embodiments, the second radiation-cured acrylate layer can be applied using other conventional coating methods such as roll coating (e.g., gravure roll coating) or spray coating (e.g., electrostatic spray coating).

In some embodiments, the second radiation-cured acrylate layer comprises more than one radiation-cured acrylate layer, with each of the radiation-cured acrylate layers having a refractive index from 1.45 to 1.55.

In some embodiments, the second radiation-cured acrylate layer is flash-evaporated and condensed on the substrate. In certain embodiments, the second radiation-cured acrylate layer has a thickness from 20 nm to 100 nm.

As mentioned before, a radiation-cured layer refers to a layer in which curing is aided by the use of any type of electromagnetic radiation, including, for example, actinic radiation, electron beam, and plasma radiation. In certain embodiments, the radiation-cured layer is cured by exposure to electron beam radiation or ultraviolet radiation.

In some embodiments, the second radiation-cured acrylate layer is adjacent the substrate. In other embodiments, the second radiation-cured acrylate layer is immediately adjacent the substrate.

In certain embodiments, in addition to being adjacent the substrate, the second radiation-cured acrylate layer is also adjacent the second layer comprising a silicon compound. In other embodiments, in addition to being immediately adjacent the substrate, the second radiation-cured acrylate layer is also immediately adjacent the second layer comprising a silicon compound. That is, in some embodiments, the second radiation-cured acrylate layer is between the substrate and the second layer comprising a silicon compound.

Substrate

In one embodiment, the substrate comprises a polyester. In other embodiments, the polyester is polyethylene terephthalate (PET). The skilled person would understand that various types of polyesters can be used as substrates for the present low emissivity films. For example, useful polyester polymers include polymers having terephthalate or naphthalate comonomer units, for example, polyethylene naphthalate (PEN), polyethylene terephthalate (PET) and copolymers and blends thereof. Examples of other suitable polyester copolymers are provided in, for example, published patent application WO 99/36262 and in WO 99/36248, both of which are incorporated herein by reference for their disclosure of polyester copolymers. Other suitable substrate materials include polycarbonates, polyarylates, and other naphthalate and terephthalate-containing polymers, such as, for example, polybutylene naphthalate (PBN), polypropylene naphthalate (PPN), and blends and copolymers of the above with each other or with non-polyester polymers.

In certain embodiments, the films of this disclosure further comprise an adhesive, such as a pressure sensitive adhesive, adjacent (or immediately adjacent) the substrate. In other embodiments, the films comprising the adhesive adjacent (or immediately adjacent) the substrate further comprise a suitable liner.

Protective Layer

The protective layer is optional. In certain embodiments, in order to protect the film, the exposed surface of the film can be protected with an additional layer that can be coated, co-extruded, or laminated onto the outermost layer. In some embodiments, when present, the protective layer becomes the outermost layer. In one embodiment, the protective layer can be coated and can comprise a scratch and wear resistant hardcoat. The protective layer can improve the durability and weatherability of the film during processing and during use of the end product. The protective layer can include any useful material, such as acrylic hardcoats, silica-based hardcoats, siloxane hardcoats, melamine hardcoats, and the like. In the case of acrylic hardcoats, the protective layer can contain one or more acrylic polymers. The hardcoat can be any useful thickness that would maintain low emissivity of the film, such as, for example, from 1 to 200 nm, or 1 to 100 nm, or 1 to 50 nm, or from 5 to 10 nm.

In some embodiments, the protective layer comprises a third radiation-cured acrylate layer.

Third Radiation-Cured Acrylate Layer

The third radiation-cured acrylate layer is optional. In some embodiments, the third radiation-cured acrylate layer is part of the outermost layer, which may comprise the third radiation-cured acrylate layer and other additional layers. If the outermost layer only comprises the third radiation-cured acrylate layer, then the third radiation-cured acrylate layer becomes the outermost layer.

The third radiation-cured acrylate layer can be made in the same manner as the first and second radiation-cured acrylate layers, and comprising the same components as in those layers. In other embodiments, the acrylate polymers include blends comprising tris (2-hydroxy ethyl) isocyanurate triacrylate, acid-modified epoxy acrylate, and fluorinated acrylic compound, such as KY1203 from Shin-Etsu. In addition to any suitable acrylate polymers, the third radiation-cured acrylate layer can also comprise a fluoropolymer. In those embodiments in which the third radiation-cured acrylate layer comprises a fluoropolymer, then the third radiation-cured acrylate layer is the outermost layer.

Fluoropolymer

In certain embodiments, the fluoropolymer used in the third radiation-cured acrylate layer is a material that is capable of being extruded. In some embodiments, the fluoropolymer may be a partially fluorinated polymer. For example, the fluoropolymer may be either melt-processible such as in the case of polyvinylidene fluoride (PVDF), a terpolymer of tetrafluoroethylene, hexafluoropropylene and vinylidene fluoride (THV), and other melt-processible fluoroplastics, or may be non-melt processable such as in the case of modified PTFE copolymers, such as a copolymer of TFE and low levels of fluorinated vinyl ethers and fluoroelastomers. Fluoroelastomers may be processed before they are cured by injection or compression molding or other methods normally associated with thermoplastics. Fluoroelastomers after curing or crosslinking may not be able to be further processed. Fluoroelastomers may also be coated out of solvent in their uncross linked form. In one embodiment, the fluoropolymer blended with the acrylic polymer is PVDF.

In other embodiments, the fluoropolymer is a fluoroplastic including interpolymerized units derived from VDF and fluoroethylene and may further include interpolymerized units derived from other fluorine-containing monomers, non-fluorine-containing monomers, or a combination thereof. Examples of suitable fluorine containing monomers include tetrafluoroethylene (TFE), hexafluoropropylene (HFP), chlorotrifluoroethylene (CTFE), 3-chloropentafluoropropene, perfluorinated vinyl ethers (e.g., perfluoroalkoxy vinyl ethers such as $CF_3OCF_2CF_2CF_2OCF=CF_2$ and perfluoroalkyl vinyl ethers such as $CF_3OCF=CF_2$ and $CF_3CF_2CF_2CF=CF_2$), vinyl fluoride, and fluorine-containing di-olefins such as perfluorodiallylether and perfluoro-1,3-butadiene. Examples of suitable nonfluorine-containing monomers include olefin monomers such as ethylene, propylene, and the like.

VDF-containing fluoroplastics may be prepared using emulsion polymerization techniques as described, e.g., in Sulzbach et al., U.S. Pat. No. 4,338,237 or Grootaert, U.S. Pat. No. 5,285,002, hereby incorporated by reference. Useful commercially available VDF-containing fluoroplastics include, for example, THV™ 200, THV™ 400, THV™ 5000, THV™ 610X fluoropolymers (available from Dyneon LLC, St. Paul, Minn.), KYNAR™ 740 fluoropolymer (available from Atochem North America, Philadelphia, Pa.), HYLAR™ 700 (available from Ausimont USA, Inc., Morristown, N.J.), and FLUOREL™ FC-2178 (available from Dyneon LLC).

Other examples of fluoropolymers include THE (a terpolymer of $CF_2=CF_2/CF_3CF=CF_2/CH_2=CH_2$), PVDF-HV (a copolymer $CF_2=CH_2$ (85 wt %) and $CF_3CF=CF_2$ (15 wt %)) and PVDF-CV (a copolymer of $CF_2=CH_2$ (85 wt %) and $CF_2=CFCl$ (15 wt %)).

Additives

In some embodiments, the outermost layer comprises slip particles. In another embodiment, the slip particles are chosen from $SiO_2$, $CaCO_3$, and organic slip particles. In one embodiment, one or both of the outer layers are free of dyes and/or particulate pigments.

In some embodiments, any layer in the film, independently of each other, may comprise a stabilizer such as a UV absorber (UVA) or hindered amine light stabilizer (HALS).

Ultraviolet absorbers function by preferentially absorbing ultraviolet radiation and dissipating it as thermal energy. Suitable UVAs may include: benzophenones (hydroxybenzophenones, e.g., Cyasorb 531 (Cytec)), benzotriazoles (hydroxyphenylbenzotriazoles, e.g., Cyasorb 5411, Tinuvin 329 (Ciba Geigy)), triazines (hydroxyphenyltriazines, e.g., Cyasorb 1164), oxanilides, (e.g., Sanuvor VSU (Clariant)) cyanoacrylates (e.g., Uvinol 3039 (BASF)), or benzoxazinones. Suitable benzophenones include, CYASORB UV-9 (2-hydroxy-4-methoxybenzophenone, CHIMASSORB 81 (or CYASORB UV 531) (2 hydroxy-4 octyloxybenzophenone).

Suitable benzotriazole UVAs include compounds available from Ciba, Tarrytown, N.Y. as TINUVIN P, 213, 234, 326, 327, 328, 405 and 571, and CYASORB UV 5411 and CYASORB UV 237. Other suitable UVAs include CYASORB UV 1164 (2-[4,6-bis(2,4-dimethylphenyl)-1,3,5-triazin-2yl]-5(oxctyloxy) phenol (an exemplary triazine) and CYASORB 3638 (an exemplary benzoxiazine).

Hindered amine light stabilizers (HALS) are efficient stabilizers against light-induced degradation of most polymers. HALS do not generally absorb UV radiation, but act to inhibit degradation of the polymer. HALS typically include tetra alkyl piperidines, such as 2,2,6,6-tetramethyl-4-piperidinamine and 2,2,6,6-tetramethyl-4-piperidinol. Other suitable HALS include compounds available from Ciba, Tarrytown, N.Y. as TINUVIN 123, 144, and 292.

The UVAs and HALS disclosed explicitly here are intended to be examples of materials corresponding to each of these two categories of additives. The present inventors contemplate that other materials not disclosed here but known to those skilled in the art for their properties as UV absorbers or hindered amine light stabilizers can be used in the films of this disclosure.

Adhesives

Adhesive compositions suitable to be used with or in window films are well known to those of ordinary skill in the art. In certain embodiments, the adhesives used in the films of the present disclosure include heat activated adhesives and pressure sensitive adhesives (PSAs). Heat activated adhesives are non-tacky at room temperature but become tacky and capable of bonding to a substrate at elevated temperatures. These adhesives usually have a glass transition temperature (Tg) or melting point (Tm) above room temperature. When the temperature is elevated above the Tg or Tm, the storage modulus usually decreases and the adhesive becomes tacky.

Pressure sensitive adhesives suitable to be used in the instant films possess properties at room temperature including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power.

The pressure sensitive adhesives may be (meth)acrylate-based pressure sensitive adhesives. Useful alkyl (meth) acrylates (i.e., acrylic acid alkyl ester monomers) include linear or branched monofunctional unsaturated acrylates or methacrylates of non-tertiary alkyl alcohols, the alkyl groups of which have from 4 to 14 and, in particular, from 4 to 12 carbon atoms. Poly(meth)acrylic pressure sensitive adhesives are derived from, for example, at least one alkyl (meth)acrylate ester monomer such as, for example, isooctyl acrylate, isononyl acrylate, 2-methyl-butyl acrylate, 2-ethyl-n-hexyl acrylate and n-butyl acrylate, isobutyl acrylate, hexyl acrylate, n-octyl acrylate, n-octyl methacrylate, n-nonyl acrylate, isoamyl acrylate, n-decyl acrylate, isodecyl acrylate, isodecyl methacrylate, isobornyl acrylate, 4-methyl-2-pentyl acrylate and dodecyl acrylate; and at least one optional co-monomer component such as, for example, (meth)acrylic acid, vinyl acetate, N-vinyl pyrrolidone, (meth)acrylamide, a vinyl ester, a fumarate, a styrene macromer, alkyl maleates and alkyl fumarates (based, respectively, on maleic and fumaric acid), or combinations thereof.

Windows and Glazing Articles

In some embodiments, the films of this disclosure may be attached to glazing substrates to provide articles, such as windows or glazing articles with low emissivity properties. Examples or suitable glazing substrates may be prepared from a variety of different materials including, for example, a variety of different types of glass or from polymeric materials such as polyolefins, polyimides, polycarbonates or polymethyl methacrylates. In some embodiments, the glazing substrate may also comprise additional layers or treatments. Examples of additional layers include, for example, additional layers of film designed to provide glare reduction, tinting, shatter resistance and the like. Examples of additional treatments that may be present on glazing substrates include, for example, coatings or various types such as hardcoats, and etchings such as decorative etchings.

As mentioned previously, in some embodiments, the films contain an adhesive layer on a suitable surface of the optical film to laminate the film to a first glazing substrate. The adhesive layer may be protected by a release liner.

As mentioned above, the adhesive may also be removable, meaning adhesives with relatively low initial adhesion, permitting temporary removability from and repositionability on a substrate, with a building of adhesion over time to form a sufficiently strong bond. This can particularly useful when large areas of a substrate are to be laminated.

In certain embodiments, the lamination of a film to a large surface substrate has been accomplished by what is sometimes called a "wet" application process. The wet application process involves spraying a liquid, typically a water/surfactant solution, onto the adhesive side of the large format article, and optionally onto the substrate surface. The liquid temporarily "detackifies" the pressure sensitive adhesive so the installer may handle, slide, and re-position the large format article into a desired position on the substrate surface. The liquid also allows the installer to pull the large format article apart if it sticks to itself or prematurely adheres to the surface of the substrate. Applying a liquid to the adhesive may also improve the appearance of the installed large format film by providing a smooth, bubble free appearance with good adhesion build on the surface of the substrate.

While the wet application process has been used successfully in many instances, it is a time consuming and messy process. Therefore, in certain embodiments, a "dry" application process may be generally desirable for installing large format films. Adhesives that are self wetting and removable may be applied with a dry installation process. The articles are easily attached to a large substrate because they are self wetting and yet they may be easily removed and repositioned as needed.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following examples are on a weight basis. Reagents were purchased from Sigma Aldrich Company, St. Louis, Mo., unless otherwise noted.

Materials

| Reagent | Trade name or abbreviation | Source |
|---|---|---|
| 3-Methacryloxypropyl-trimethoxysilane | SILQUEST A174 | Momentive Performance Materials Inc., Waterford, NY |
| 4-Hydroxy-2,2,6,6-tetramethylpiperidine | PROSTAB | BASF, Florham Park, NJ |
| $SiO_2$ sol, 20 nm particle diameter | NALCO 2327 | Nalco Company, Naperville, IL |
| $SiO_2$ sol, 75 nm particle diameter | NALCO 2329 | Nalco Company, Naperville, IL |
| Tris (2-hydroxy ethyl) isocyanurate triacrylate | SR368 | Sartomer Americas, Exton, PA |
| Acid-modified epoxy acrylate | KRM 8762 | Daicel-Allnex, Ltd., Tokyo, Japan |
| Fluorinated acrylic compound | KY1203 | Shin-Etsu, Akron, OH |
| Silicone acrylate | Tegorad 2500 | Evonik, Parsippany, NJ |
| Benzil dimethyl ketal | Esacure KB1 | Lamberti USA Inc., Conshohocken, PA |
| Tricyclodecane dimethanol diacrylate | SR833 | Arkema, Inc., King of Prussia, PA |
| 1-Hydroxycyclohexyl phenyl ketone | Irgacure™ 184 | BASF, Florham Park, NJ |
| Acidic acrylic oligomer | CN147 | Arkema, Inc., King of Prussia, PA |
| PET film, 0.075 mm thick | Melinex™ 454 | DuPont Teijin Films, Chester, VA |
| Titanium sputtering target | — | Soleras Advanced Coatings, Biddeford, ME |
| Silicon-aluminum sputtering target (90:10) | — | Soleras Advanced Coatings, Biddeford, ME |
| Zirconium sputtering target | — | Soleras Advanced Coatings, Biddeford, ME |
| Silver-gold alloy sputtering target (85:15) | — | Soleras Advanced Coatings, Biddeford, ME |
| Aluminum zinc oxide sputtering target | — | Soleras Advanced Coatings, Biddeford, ME |
| Methyl ethyl ketone | MEK | Sigma Aldrich, St. Louis, MO |
| Dimethyl sulfoxide | DMSO | Sigma Aldrich, St. Louis, MO |
| Glacial acetic acid | — | Sigma Aldrich, St. Louis, MO |
| 1-Methoxy-2-propanol | Dowanol PM | Dow Chemical Co., Midland, MI |

Test Methods

Emissivity

Emissivity was measured in accordance with ASTM C1371.

Visible Light Transmission

Spectral properties of films were measured in accordance with ASTM E903 in a Perkin Elmer Lambda 1050 spectrophotometer. The transmission and reflectance spectra were formatted for software compatibility and the data imported into Optics 6, which is publicly available glazing analysis software available from Lawrence Berkeley National Laboratories, Berkeley, Calif. (http://windows.lbl.gov/software/Optics/optics.html, last accessed on 9 Apr. 2015). NFRC_300_2003 was chosen as the standard for the calculation of visible light transmission.

Visible Light Reflection

Spectral properties of films were measured in accordance with ASTM E903 in a Perkin Elmer Lambda 1050 spectrophotometer. The transmission and reflectance spectra were formatted for software compatibility and the data imported into Optics 6, which is publicly available glazing analysis software available from Lawrence Berkeley National Laboratories, Berkeley, Calif. (http://windows.lbl.gov/software/Optics/optics.html, last accessed on 9 Apr. 2015). NFRC_300_2003 was chosen as the standard for the calculation of visible light reflection.

Elemental Composition

Compositional depth profiles were obtained via x-ray photoelectron spectroscopy (XPS) in conjunction with argon ion sputter etching. Data were obtained with a Physical Electronics Quantera II instrument utilizing monochromatic aluminum K-alpha x-rays and a 2 keV $Ar^+$ ion beam. Intensities of the measured photoelectron peaks were integrated and converted to atomic concentrations using the relative sensitivity factors provided in the instrument manufacturer's software (Physical Electronics Multipak).

Layer Thickness

Samples for TEM investigation were prepared by cryo-ultramicrotomy. Film samples were first cut out of the web (approximately 1"×1"). The side-of-interest was sputter-coated with a thin Au—Pd layer to mark the surface, then 'house-shapes' (optimal size and shape for a standard Leica UC7 ultramicrotome) were cut out with a scalpel blade and embedded in Scotchcast Electrical Resin #5. The embedded samples were allowed to cure overnight at room temperature before microtomy slicing. Cryo-ultramicrotomy was performed at temperatures between −35° and −50° C., and cutting was done either over a $DMSO:H_2O$ (60:40) solution or dry. In the cryo-chamber, the thin sections were collected onto standard carbon/formvar 200 mesh Cu TEM grids. Samples were allowed to warm up to room-temperature under a dry $N_2$ purge. Three modes of transmission electron microscopy were used on an FEI Osiris field emission TEM (200 kV): Standard Bright Field (BF) imaging, scanning transmission electron microscopy (STEM) imaging, and high angle annular dark field (HAADF) imaging.

X-ray microanalysis was performed using the Bruker Espirit Super-X quad x-ray SDD (silicon drift detector) and accompanying analysis software system. Data was collected with the TEM in HAADF mode (Spot Size 10, Camera Length 220 nm). Quantitative elemental concentrations were calculated from background subtracted, deconvolved line intensities using the Cliff-Lorimer method in the Espirit analysis software. Standard deviations of 3σ error were also determined for all the quantitative data. In order for adequate counting statistics, each x-ray scan was run between 14,000 and 28,000 sec.

Measurement of Color

Color measurements were made using an Ultrascan PRO color measurement device (available from Hunter Associates Laboratory, Reston, Va., USA). D65 illuminant and 10° observer were used for calculating the color coordinates. In the case of reflectance, specular included configuration was used.

Resistance to Condensed Water

Material to be tested was taped on a 3 mm thick glass panel with the coated surface facing away from the glass surface and affixed to the sample holder. The sample holder was placed in a Q-lab, model Se (available from Q-Lab Corporation, Westlake, Ohio). The weathering machine was operated at 50° C. and 100% condensation cycle. No lights were used. The film samples were taken out after 200 hours of testing and observed visually as well as under a microscope. Delamination of layers or other deterioration resulting from the constant presence of water on the coated surface, if any, was noted.

Resistance to Dilute Acetic Acid

The sample to be tested was taped on a 3 mm thick glass plate with the coated side facing away from the glass surface and placed in a chemical hood. About 5 drops of glacial acetic acid diluted to 10% by weight in water were placed on the surface of the sample to be tested. A 2"×3" glass slide was placed over the acetic acid drops so as to completely wet out the surface to be tested. The glass slide was removed after one hour and the test sample washed under running water for 30 seconds. The sample was air dried and evaluated for evidence of breakthrough or damage from contact with acetic acid. The samples were rated according to the criteria in Table 1.

TABLE 1

Rating system for resistance to dilute acetic acid.

| Rating | Description |
|---|---|
| 0 | No change in surface at the contact area |
| 1 | Very minor change in surface only detectable under close scrutiny |
| 2 | Very slight surface haze, only detectable under close scrutiny |
| 3 | Moderate surface haze, but no evidence of discoloration |
| 4 | Significant surface haze, very minor hardcoat adhesion loss, but still no discoloration |
| 5 | Significant surface haze, moderate hardcoat adhesion loss, very mild discoloration |
| 6 | Significant hardcoat adhesion loss, moderate discoloration easily detectable in transmission |
| 7 | Significant discoloration, very slight metal layer loss |
| 8 | Significant discoloration, moderate metal layer loss |
| 9 | Nearly complete metal layer loss in the contact area |
| 10 | Metal layer loss/discoloration throughout entire test coupon |

Resistance to Scratching with Steel Wool

Samples were taped to a 6 mm thick glass plate and affixed to a linear abrader (Taber Industries Model 5750 Linear Abraser, Tonawanda, N.Y.). Steel wool pad (Magic Sand—#0000 Grade, Item #1113 available from Hut Products, Fulton, Mo., USA), die cut into 1" diameter circle, was attached to the reciprocating shaft, which was operated for 10 cycles at 30 cycles per min. Total weight on the sample being scratch tested was 500 grams. After the testing was completed, a scratch resistance rating according to Table 2 was assigned.

TABLE 2

Rating system for scratch resistance.

| Rating | Observation |
|---|---|
| 0 | No scratches |
| 1 | Very few shallow scratches difficult to discern visually |
| 2 | Large number of shallow scratches and a few deep scratches |
| 3 | Large number of shallow and deep scratches easily discernable |
| 4 | One or more layers completely removed |

Formulations and Film Constructions

Preparation of $SiO_2$ Nanoparticle Sols

A surface modified silica sol ("Sol 1") was prepared by adding 25.25 grams of 3-methacryloxypropyl-trimethoxysilane ("SILQUEST A174") and 0.5 gram of 4-hydroxy-2,2,6,6-tetramethylpiperidine 1-oxyl (5 wt. %; "PROSTAB") to 450 grams of 1-methoxy-2-propanol, which was in turn added to 400 grams of $SiO_2$ sol (20 nm diameter; obtained under the trade designation "NALCO 2327") in a glass jar and then stirred at room temperature for 10 minutes. The jar was sealed and placed in an oven at 80° C. for 16 hours. The water was removed from the resulting solution with a rotary evaporator at 60° C. until the solid wt. % of the solution became close to 45 wt. %. Then 200 grams of 1-methoxy-2-propanol was charged into the resulting solution, and the remaining water removed by using the rotary evaporator at 60° C. This latter step was repeated for a second time to further remove water from the solution. The concentration of $SiO_2$ nanoparticles was adjusted to 42.7 wt. % by adding 1-methoxy-2-propanol. This sol is referred to as "Sol 1" in this application.

A second surface modified silica sol ("Sol 2") was prepared by modifying $SiO_2$ sol (75 nm diameter; obtained under the trade designation "NALCO 2329") in the same manner as "Sol 1" except that 5.95 grams of 3-methacryloxypropyl-trimethoxysilane ("SILQUEST A174") and 0.5 gram of 4-hydroxy-2,2,6,6-tetramethylpiperidine 1-oxyl (5 wt. %; "PROSTAB") were used, resulting in a $SiO_2$ sol containing 42.26 wt. % surface modified $SiO_2$ nanoparticles with an average size of 75 nm.

Acrylate Formulations

Acrylate formulations designated Formulation 1 and Formulation 2 were prepared by combining the reagents indicated in Tables 3 and 4, respectively. Each formulation was shaken vigorously for about 1 minute till a clear solution was obtained.

TABLE 3

Composition of Formulation 1.

| Material Name | % Solids | Solids Wt % | Material Wt % |
|---|---|---|---|
| SR368 | 100% | 39.5% | 0.79% |
| KRM 8762 | 100% | 39.5% | 0.79% |
| KY1203 | 20% (in MEK) | 3.5% | 0.35% |
| Tegorad 2500 (in methyl ethyl ketone) | 20% | 2.5% | 0.25% |
| Esacure KB1 | 100% | 5.0% | 0.10% |
| Sol 1 | 42.7% | 0.0% | 0.00% |
| Sol 2 | 42.26% | 10.0% | 0.47% |
| Dowanol PM | 0% | 0.0% | 48.62% |
| MEK | 0% | 0.0% | 48.62% |

TABLE 4

Composition of Formulation 2.

| Material Name | % solids | Solids Wt % | Material Wt % |
|---|---|---|---|
| SR368 | 100% | 44.5% | 0.58% |
| KRM 8762 | 100% | 44.5% | 0.58% |
| KY1203 | 20% (in MEK) | 3.5% | 0.23% |
| Tegorad 2500 (in methyl ethyl ketone) | 20% | 2.5% | 0.03% |
| Esacure KB1 | 100% | 5.0% | 0.07% |
| Dowanol PM | 0% | 0.0% | 49.26% |
| MEK | 0% | 0.0% | 49.26% |

Example 1

A multilayer optical stack comprising zirconium nitride, a silver alloy, silicon oxide or oxynitride, and cured acrylate layers was deposited on a PET film substrate, as described below and shown in Table 5. Table 5 summarizes the film constructions and test results for all examples. The individual layers were formed using a vacuum coating apparatus similar to the one described in FIG. 3 of WO2009085741. A 0.075 mm thick poly(ethylene terephthalate) (PET) film available from DuPont Teijin Films under the designation Melinex™ 454 was used for the substrate. No distinction was made regarding the side of the substrate to be coated.

(Layer 1) The substrate roll was loaded into a vacuum coater and the chamber pumped down to a base pressure of less than $1\times10^{-4}$ torr. The film was exposed to a $N_2$ plasma pre-treatment process using a titanium target run at 200 W. An acrylate monomer mixture comprising SR833, Irgacure™ 184, and CN147 in the ratio 93:6:1, respectively, was flash evaporated, condensed on the PET film substrate and cured with a UV radiation source (Heraeus Noblelight UV Lamp NIQ 500). The monomer flow rate, monomer condensation rate, and web speed were chosen to result in a cured polymer layer thickness of approximately 1.3 μm.

(Layer 2) A silicon aluminum oxynitride layer approximately 20 nm thick was deposited using a reactive magnetron sputtering process on layer 1. A silicon-aluminum target consisting of 90% Si and 10% Al was used for the deposition of this layer. Gas flow consisting of up to 95% nitrogen (balance oxygen) was used in the deposition process. Pressure in the sputtering zone was maintained at less than approximately 3 mTorr. The composition of the resulting coating was approximately 38% Si, 42% N, 15% O and 5% Al.

(Layer 3) A zirconium nitride layer was deposited on layer 2 using a reactive magnetron sputtering process under a nitrogen atmosphere. Power settings and line speed chosen resulted in a coating thickness less than 3 nm.

(Layer 4) A gold-silver alloy layer, approximately 12 nm thick, was deposited on the zirconium nitride layer using a magnetron sputtering process. The alloy target consisted of approximately 85% silver and 15% gold.

(Layer 5) A second zirconium nitride layer was deposited over the gold-silver alloy layer using the same process conditions as for layer 3.

(Layer 6) The acrylate mixture used in layer 1 was flash evaporated, condensed on layer 5 and cured with a UV radiation source (Heraeus Noblelight UV Lamp NIQ 500). The deposition conditions were chosen to obtain a coating thickness of approximately 40 nm.

(Layer 7) A silicon oxide layer was sputter deposited on layer 6 using a silicon aluminum target consisting of 90% silicon and 10% aluminum. An oxygen atmosphere was maintained during the deposition process. The coating thickness obtained under the process conditions was approximately 26 nm.

(Layer 8) A solution of Formulation 1 was coated on layer 7 using a slot die coating process to obtain a wet coating thickness of approximately 0.1 microns. The coating was dried in the oven to evaporate all the solvent and cured with a UV lamp (Fusion Systems H-bulb) operating at 300 W. The resulting dried coating thickness was approximately 32 nm.

Example 2

A film sample was produced according to the process described in Example 1 except that during the deposition of layer 7, a mixture of oxygen and nitrogen were used, resulting in the deposition of silicon aluminum oxynitride approximately 14 nm thick. Elemental composition of the layer was similar to the layer 2 of Example 1.

Example 3

A film sample was produced according to the process described in Example 1 except layer 8 was not applied to the stack.

Example 4

A film sample was produced according to the process described in Example 3 except that the Layer 7 of Example 2 was used.

Example 5

A film sample was produced according to the process described in Example 1 except that layer 8 was applied and radiation-cured using an e-beam source operating at 7 kV and 7 mA. The monomer mixture used for layer 8 was same as layer 6.

Example 6

A film sample was produced according to the process described in Example 1 except that Formulation 2 was used for coating Layer 7. Thickness of Layer 6 and 7 were approximately 50 and 60 nm, respectively.

Example 7

A film sample was produced according to the process described in Example 4 except during the deposition of layers 3 and 5, only argon was used as the sputtering gas (nitrogen flow was turned off).

Example 8

A film sample was produced according to the process described in Example 4 except that aluminum zinc oxide was used for Layers 3 and 5 and electron beam radiation was used for curing layer 6. Aluminum zinc oxide was sputtered from an aluminum zinc oxide target without adding any oxygen during the sputtering process. The process conditions chosen resulted in a coating thickness of less than 3 nm for Layers 3 and 5.

Example 9

A film sample as described in Example 1 was produced except that layers 7 and 8 were not coated.

Example 10

A film sample as described in Example 6 was produced except that Formulation 1 was used for coating Layer 7. Electron beam radiation was used for curing layer 6.

Example 11

A sample as described in Example 8 was produced except that ZrN was used for coating Layer 5.

TABLE 5

Layer construction of Examples and results of optical measurements and environmental resistance testing.

| | | Example | | | | | |
|---|---|---|---|---|---|---|---|
| | | 1 | 2 | 3 | 4 | 5 | 6 |
| Layer 1 | Material | acrylic polymer | acrylic polymer | acrylic polymer | acrylic polymer | acrylic polymer | acrylic polymer |
| | Thickness | 1.3 μm | 1.3 μm | 1.3 μm | 1.3 μm | 1.3 μm | 1.3 μm |
| Layer 2 | Material | SiAlON | SiAlON | SiAlON | SiAlON | SiAlON | SiAlON |
| | Thickness | 20 nm | 20 nm | 20 nm | 20 nm | 20 nm | 20 nm |
| Layer 3 | Material | ZrN | ZrN | ZrN | ZrN | ZrN | AZO |
| | Thickness | 3 nm | 3 nm | 3 nm | 3 nm | 3 nm | 3 nm |
| Layer 4 | Material | AuAg | AuAg | AuAg | AuAg | AuAg | AuAg |
| | Thickness | 12 nm | 12 nm | 12 nm | 12 nm | 12 nm | 12 nm |
| Layer 5 | Material | ZrN | ZrN | ZrN | ZrN | ZrN | AZO |
| | Thickness | 3 nm | 3 nm | 3 nm | 3 nm | 3 nm | 3 nm |
| Layer 6 | Material | Acrylic polymer | Acrylic polymer | Acrylic polymer | Acrylic polymer | Acrylic polymer | Acrylic polymer |
| | Thickness | 40 nm | 40 nm | 40 nm | 40 nm | 40 nm | 85 nm |
| Layer 7 | Material | SiAlO | SiAlO | SiAlO | SiAlO | SiAlO | Formulation 2 |
| | Thickness | 26 nm | 14 nm | 26 nm | 14 nm | 26 nm | 60 nm |
| Layer 8 | Material | Formulation 1 | Formulation 1 | — | — | acrylic polymer | — |
| | Thickness | 32 nm | 32 nm | | | — | |
| Emissivity | | 0.16 | 0.16 | 0.14 | 0.15 | 0.13 | — |
| Visible Light Transmission | | 82 | 73 | 81 | 83 | — | 69 |
| Visible Light Reflection | | 12 | 20 | 10 | — | — | — |
| Reflected Color | L* | 34.9 | 49.2 | 36.7 | 38.0 | 42.0 | 55.8 |
| | a* | 2.6 | -3.0 | 1.6 | 1.1 | 2.1 | 3.0 |
| | b* | 0.8 | -4.8 | -0.2 | -4.5 | -1.7 | 17.7 |
| Transmitted Color | L* | 92.4 | 87.3 | 92.4 | 92.2 | 91.0 | — |
| | a* | -1.9 | -0.4 | -1.3 | -1.1 | -0.6 | — |
| | b* | -0.8 | -0.1 | 0.5 | 1.2 | 0.8 | — |
| Resistance to condensed water | | No delamination after 600 hrs | No delamination after 600 hrs | No delamination after 600 hrs | No delamination after 600 hrs | — | Delamination after 25 hrs |
| Resistance to dilute acetic acid | | 0 | 0 | 0 | 0 | — | 2 |
| Resistance to scratching | | 1 | 1 | 1 | 3 | 2 | 3 |

| | | Example | | | | |
|---|---|---|---|---|---|---|
| | | 7 | 8 | 9 | 10 | 11 |
| Layer 1 | Material | acrylic polymer | acrylic polymer | acrylic polymer | acrylic polymer | acrylic polymer |
| | Thickness | 1.3 μm | 1.3 μm | 1.3 μm | 1.3 μm | 1.3 μm |
| Layer 2 | Material | SiAlON | SiAlON | SiAlON | SiAlON | SiAlON |
| | Thickness | 20 nm | 20 nm | 20 nm | 20 nm | 20 nm |
| Layer 3 | Material | Zr | AZO | ZrN | AZO | AZO |
| | Thickness | 3 nm | 3 nm | 3 nm | 3 nm | 3 nm |
| Layer 4 | Material | AuAg | AuAg | AuAg | AuAg | AuAg |
| | Thickness | 12 nm | 12 nm | 12 nm | 12 nm | 12 nm |
| Layer 5 | Material | Zr | AZO | ZrN | AZO | ZrN |
| | Thickness | 3 nm | 3 nm | 3 nm | 3 nm | 3 nm |
| Layer 6 | Material | Acrylic polymer | Acrylic polymer | Acrylic polymer | Acrylic polymer | Acrylic polymer |
| | Thickness | 40 nm | 40 nm | 40 nm | 40 nm | 40 nm |
| Layer 7 | Material | SiAlON | SiAlON | — | Formulation 1 | SiAlON |
| | Thickness | 20 nm | 20 nm | | 30 nm | 26 nm |
| Layer 8 | Material | — | — | — | — | — |
| | Thickness | | | | | |
| Emissivity | | 0.16 | 0.17 | 0.15 | 0.14 | 0.15 |
| Visible Light Transmission | | 67 | 82 | — | 78 | 84 |
| Visible Light Reflection | | 8 | — | — | 12 | — |
| Reflected Color | L* | — | 39.6 | 35.4 | — | 34.6 |
| | a* | — | 6.2 | 9.3 | — | 6.7 |
| | b* | — | -6.1 | 15.0 | — | -5.2 |
| Transmitted Color | L* | — | — | — | — | — |
| | a* | — | — | — | — | — |
| | b* | — | — | — | — | — |
| Resistance to condensed water | | — | — | — | Delamination spots after 6 hrs | — |
| Resistance to dilute acetic acid | | — | — | — | 9 | — |

TABLE 5-continued

Layer construction of Examples and results of optical measurements and environmental resistance testing.

| | | | | | |
|---|---|---|---|---|---|
| Resistance to scratching | — | — | 1 | — | — |

Exemplary Embodiments

1. A film comprising the following layers in the recited order:
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof,
   a first radiation-cured acrylate layer;
   a first layer comprising zirconium nitride, wherein the layer has a thickness from 1 to 15 nm;
   a metal layer,
   a second layer comprising zirconium nitride, wherein the layer has a thickness from 1 to 15 nm;
   a second layer comprising a silicon compound, wherein the silicon compound is chosen from silicon aluminum oxide and silicon aluminum oxynitride, silicon oxide, silicon oxynitride silicon nitride, silicon aluminum nitride, and combinations thereof,
   a second radiation-cured acrylate layer;
   a substrate;
   wherein the film has an emissivity of less than 0.2,
   wherein the film has a visible reflectance of less than 25%; and
   wherein the film has a visible transmission greater than 50%.

2. The film according to embodiment 1, further comprising a protective layer comprising a third radiation-cured acrylic polymer immediately adjacent the first layer comprising a silicon compound.

3. The film according to embodiment 2, wherein the protective layer comprising the third radiation-cured acrylic polymer further comprises silica nanoparticles having a diameter from 5 nm to 75 nm.

4. The film according to embodiment 2 or embodiment 3, wherein the third radiation-cured acrylic polymer comprises a fluoroacrylate polymer.

5. The film according to any of the preceding embodiments, wherein the film is substantially color neutral in both transmission and reflection as defined by CIELAB color values.

6. The film according to any of the preceding embodiments, wherein the film has an emissivity of less than 0.16.

7. The film according to any of the preceding embodiments, wherein the film has an emissivity of less than 0.12.

8. The film according to any of the preceding embodiments, wherein the film has a visible reflectance of less than 20%.

9. The film according to any of the preceding embodiments, wherein the film has a visible reflectance of less than 15%.

10. The film according to any of the preceding embodiments, wherein the film has a visible transmission greater than 55%.

11. The film according to any of the preceding embodiments, wherein the film has a visible transmission greater than 60%.

12. The film according to any of the preceding embodiments, wherein the film has a visible transmission greater than 65%.

13. The film according to any of the preceding embodiments, wherein the film has a visible transmission greater than 70%.

14. The film according to any of the preceding embodiments, wherein the film has a visible transmission greater than 75%.

15. The film according to any of the preceding embodiments, wherein the film has a visible transmission greater than 80%.

16. The film according to any of the preceding embodiments, wherein the film further comprises a grey metal layer adjacent any of the other layers in the film.

17. The film according to any of the preceding embodiments, wherein the metal layer comprises one or more metallic component chosen from silver, gold, copper, nickel, iron, cobalt, zinc, and alloys of one or more metal chosen from gold, copper, nickel, iron, cobalt, and zinc.

18. The film according to any of the preceding embodiments, wherein the metal layer comprises a silver-gold alloy.

19. The film according to any of the preceding embodiments, wherein the metal layer comprises a silver alloy comprising at least 80% silver.

20. The film according to any of the preceding embodiments, wherein the first radiation-cured acrylate layer comprises an acid functionalized monomer comprising from 0.01% to 10%.

21. The film according to any of the preceding embodiments, wherein the second radiation-cured acrylate layer comprises an acid functionalized monomer comprising from 0.01% to 10%.

22. The film according to any of the preceding embodiments, wherein the first radiation-cured acrylate layer comprises more than one radiation-cured acrylate layer, and wherein each of the radiation-cured acrylate layers has a refractive index from 1.45 to 1.55.

23. The film according to any of the preceding embodiments, wherein the second radiation-cured acrylate layer comprises more than one radiation-cured acrylate layer, and wherein each of the radiation-cured acrylate layers has a refractive index from 1.45 to 1.55.

24. The film according to any of the preceding embodiments, wherein the first radiation-cured acrylate layer has a thickness from 20 nm to 100 nm.

25. The film according to any of the preceding embodiments, wherein the second radiation-cured acrylate layer has a thickness from 500 nm to 3000 nm.

26. The film according to any of the preceding embodiments, wherein the second radiation-cured acrylate layer has a thickness from 500 nm to 2000 nm.

27. The film according to any of the preceding embodiments, wherein the second radiation-cured acrylate layer has a thickness from 500 nm to 1500 nm.

28. The film according to any of the preceding embodiments, wherein the second radiation-cured acrylate layer has a thickness from 1200 nm to 1400 nm.

29. The film according to any of the preceding embodiments, wherein the second radiation-cured acrylate layer has a thickness of 1300 nm.

30. The film according to any of the preceding embodiments, wherein the second radiation-cured acrylate layer further comprises nanoparticles that absorb in the visible spectrum.
31. The film according to any of the preceding embodiments, wherein the second radiation-cured acrylate layer further comprises nanoparticles, wherein the nanoparticles comprise nanoparticles chosen from carbon, antimony tin oxide, indium tin oxide, tungsten tin oxide, and combinations thereof
32. The film according to any of the preceding embodiments, wherein the second radiation-cured acrylate layer further comprises carbon nanoparticles.
33. The film according to any of the preceding embodiments, wherein the second radiation-cured acrylate layer further comprises nanoparticles that absorb in the near infrared spectrum.
34. The film according to any of the preceding embodiments, wherein the first radiation-cured acrylate layer is an actinic radiation-cured acrylate layer.
35. The film according to any of the preceding embodiments, wherein the second radiation-cured acrylate layer is an actinic radiation-cured acrylate layer.
36. The film according to embodiment 2 or embodiment 3, wherein the outermost layer comprising the third radiation-cured acrylic polymer is an actinic radiation-cured acrylic polymer layer.
37. The film according to any of the preceding embodiments, wherein the silicon compound in the first layer comprising a silicon compound is silicon aluminum oxynitride.
38. The film according to any of the preceding embodiments, wherein the silicon compound in the first layer comprising a silicon compound is silicon aluminum oxynitride and the ratio of oxygen to nitrogen in the silicon aluminum oxynitride is from 0.1 to 1.
39. The film according to any of the preceding embodiments, wherein the silicon compound in the first layer comprising a silicon compound is silicon aluminum oxynitride and the ratio of oxygen to nitrogen in the silicon aluminum oxynitride is from 0.3 to 0.5.
40. The film according to any of the preceding embodiments, wherein the silicon compound in the first layer comprising a silicon compound is silicon aluminum oxynitride and the ratio of oxygen to nitrogen in the silicon aluminum oxynitride is 0.4
41. The film according to any of the preceding embodiments, wherein the silicon compound in the second layer comprising a silicon compound is silicon aluminum oxynitride and the ratio of oxygen to nitrogen in the silicon aluminum oxynitride is from 0 to 0.5.
42. The film according to any of the preceding embodiments, wherein the silicon compound in the second layer comprising a silicon compound is silicon aluminum oxynitride and the ratio of oxygen to nitrogen in the silicon aluminum oxynitride is from 0.3 to 0.5.
43. The film according to any of the preceding embodiments, wherein the silicon compound in the second layer comprising a silicon compound is silicon aluminum oxynitride and the ratio of oxygen to nitrogen in the silicon aluminum oxynitride is 0.4.
44. The film according to any of the preceding embodiments, wherein the silicon compound in the second layer comprising a silicon compound is silicon aluminum oxynitride.
45. The film according to any of the preceding embodiments, wherein the first layer comprising a silicon compound comprises silicon oxide wherein the silicon to oxygen ratio is from 0.4 to 1.0.
46. The film according to any of the preceding embodiments, wherein the first layer comprising a silicon compound comprises silicon oxide wherein the silicon to oxygen ratio is from 0.4 to 0.8.
47. The film according to any of the preceding embodiments, wherein the first layer comprising a silicon compound comprises silicon oxide wherein the silicon to oxygen ratio is 0.5.
48. The film according to any of the preceding embodiments, wherein the second layer comprising a silicon compound comprises silicon oxide wherein the silicon to oxygen ratio is from 0.4 to 1.0.
49. The film according to any of the preceding embodiments, wherein the second layer comprising a silicon compound comprises silicon oxide wherein the silicon to oxygen ratio is from 0.4 to 0.8.
50. The film according to any of the preceding embodiments, wherein the second layer comprising a silicon compound comprises silicon oxide wherein the silicon to oxygen ratio is 0.5.
51. The film according to any of the preceding embodiments, wherein the first layer comprising a silicon compound comprises silicon aluminum oxide wherein the silicon to aluminum ratio is greater than 8.
52. The film according to any of the preceding embodiments, wherein the first layer comprising a silicon compound comprises silicon aluminum oxide wherein the silicon to aluminum ratio is from 8 to 10.
53. The film according to any of the preceding embodiments, wherein the first layer comprising a silicon compound comprises silicon aluminum oxide wherein the silicon to aluminum ratio is 9.
54. The film according to any of the preceding embodiments, wherein the second layer comprising a silicon compound comprises silicon aluminum oxide wherein the silicon to aluminum ratio is greater than 8.
55. The film according to any of the preceding embodiments, wherein the second layer comprising a silicon compound comprises silicon aluminum oxide wherein the silicon to aluminum ratio is from 8 to 10.
56. The film according to any of the preceding embodiments, wherein the second layer comprising a silicon compound comprises silicon aluminum oxide wherein the silicon to aluminum ratio is 9.
57. The film according to any of the preceding embodiments, wherein the first layer comprising a silicon compound has a thickness from 10 nm to 30 nm.
58. The film according to any of the preceding embodiments, wherein the first layer comprising a silicon compound has a thickness from 20 nm to 30 nm.
59. The film according to any of the preceding embodiments, wherein the first layer comprising a silicon compound has a thickness of 25 nm.
60. The film according to any of the preceding embodiments, wherein the second layer comprising a silicon compound has a thickness from 10 nm to 30 nm.
61. The film according to any of the preceding embodiments, wherein the second layer comprising a silicon compound has a thickness from 15 nm to 25 nm.
62. The film according to any of the preceding embodiments, wherein the second layer comprising a silicon compound has a thickness of 20 nm.

63. The film according to any of the preceding embodiments, wherein the silicon compound in either the first or second layer comprising a silicon compound is surface modified to impart hydrophobicity.
64. The film according to any of the preceding embodiments, wherein the silicon compound in either the first or second layer comprising a silicon compound is surface modified to impart hydrophilicity.
65. The film according to any of the preceding embodiments, wherein the silicon compound in either the first or second layer comprising a silicon compound comprises a fluorosilane coating.
66. The film according to any of the preceding embodiments, wherein the silicon compound in either the first or second layer comprising a silicon compound comprises an acid functionalized coating.
67. The film according to any of the preceding embodiments, wherein the second layer comprising zirconium nitride has been replaced by a layer comprising an oxide chosen from aluminum zinc oxide, zinc tin oxide, tin oxide, and zinc oxide.
68. The film according to any of the preceding embodiments, wherein the first layer comprising zirconium nitride further comprises oxygen.
69. The film according to any of the preceding embodiments, wherein the first layer comprising zirconium nitride further comprises oxygen and the ratio of oxygen to nitrogen in the zirconium oxynitride is from 0 to 1.
70. The film according to any of the preceding embodiments, wherein the second layer comprising zirconium nitride further comprises oxygen.
71. The film according to any of the preceding embodiments, wherein the second layer comprising zirconium nitride further comprises oxygen and the ratio of oxygen to nitrogen in the zirconium oxynitride is from 0 to 1.
72. The film according to any of the preceding embodiments, wherein the first layer comprising zirconium nitride has a thickness of less than 15 nm.
73. The film according to any of the preceding embodiments, wherein the first layer comprising zirconium nitride has a thickness of less than 14 nm.
74. The film according to any of the preceding embodiments, wherein the first layer comprising zirconium nitride has a thickness of less than 13 nm.
75. The film according to any of the preceding embodiments, wherein the first layer comprising zirconium nitride has a thickness of less than 12 nm.
76. The film according to any of the preceding embodiments, wherein the first layer comprising zirconium nitride has a thickness of less than 11 nm.
77. The film according to any of the preceding embodiments, wherein the first layer comprising zirconium nitride has a thickness of less than 10 nm.
78. The film according to any of the preceding embodiments, wherein the first layer comprising zirconium nitride has a thickness of less than 9 nm.
79. The film according to any of the preceding embodiments, wherein the first layer comprising zirconium nitride has a thickness of less than 8 nm.
80. The film according to any of the preceding embodiments, wherein the first layer comprising zirconium nitride has a thickness of less than 7 nm.
81. The film according to any of the preceding embodiments, wherein the first layer comprising zirconium nitride has a thickness of less than 6 nm.
82. The film according to any of the preceding embodiments, wherein the first layer comprising zirconium nitride has a thickness of less than 5 nm.
83. The film according to any of the preceding embodiments, wherein the first layer comprising zirconium nitride has a thickness of less than 4 nm.
84. The film according to any of the preceding embodiments, wherein the first layer comprising zirconium nitride has a thickness from 1 nm to 14 nm.
85. The film according to any of the preceding embodiments, wherein the first layer comprising zirconium nitride has a thickness from 1 nm to 13 nm.
86. The film according to any of the preceding embodiments, wherein the first layer comprising zirconium nitride has a thickness from 1 nm to 12 nm.
87. The film according to any of the preceding embodiments, wherein the first layer comprising zirconium nitride has a thickness from 1 nm to 11 nm.
88. The film according to any of the preceding embodiments, wherein the first layer comprising zirconium nitride has a thickness from 1 nm to 10 nm.
89. The film according to any of the preceding embodiments, wherein the first layer comprising zirconium nitride has a thickness from 1 nm to 9 nm.
90. The film according to any of the preceding embodiments, wherein the first layer comprising zirconium nitride has a thickness from 1 nm to 8 nm.
91. The film according to any of the preceding embodiments, wherein the first layer comprising zirconium nitride has a thickness from 1 nm to 7 nm.
92. The film according to any of the preceding embodiments, wherein the first layer comprising zirconium nitride has a thickness from 1 nm to 6 nm.
93. The film according to any of the preceding embodiments, wherein the thickness of the first layer comprising zirconium nitride is from 1 to 5 nm.
94. The film according to any of the preceding embodiments, wherein the thickness of the first layer comprising zirconium nitride is from 1 to 4 nm.
95. The film according to any of the preceding embodiments, wherein the thickness of the first layer comprising zirconium nitride is from 2 to 4 nm.
96. The film according to any of the preceding embodiments, wherein the thickness of the first layer comprising zirconium nitride is from 1 to 3 nm.
97. The film according to any of the preceding embodiments, wherein the thickness of the first layer comprising zirconium nitride is 3 nm.
98. The film according to any of the preceding embodiments, wherein the thickness of the first layer comprising zirconium nitride is less than 3 nm.
99. The film according to any of the preceding embodiments, wherein the second layer comprising zirconium nitride has a thickness of less than 15 nm.
100. The film according to any of the preceding embodiments, wherein the second layer comprising zirconium nitride has a thickness of less than 14 nm.
101. The film according to any of the preceding embodiments, wherein the second layer comprising zirconium nitride has a thickness of less than 13 nm.
102. The film according to any of the preceding embodiments, wherein the second layer comprising zirconium nitride has a thickness of less than 12 nm.
103. The film according to any of the preceding embodiments, wherein the second layer comprising zirconium nitride has a thickness of less than 11 nm.

104. The film according to any of the preceding embodiments, wherein the second layer comprising zirconium nitride has a thickness of less than 10 nm.
105. The film according to any of the preceding embodiments, wherein the second layer comprising zirconium nitride has a thickness of less than 9 nm.
106. The film according to any of the preceding embodiments, wherein the second layer comprising zirconium nitride has a thickness of less than 8 nm.
107. The film according to any of the preceding embodiments, wherein the second layer comprising zirconium nitride has a thickness of less than 7 nm.
108. The film according to any of the preceding embodiments, wherein the second layer comprising zirconium nitride has a thickness of less than 6 nm.
109. The film according to any of the preceding embodiments, wherein the second layer comprising zirconium nitride has a thickness of less than 5 nm.
110. The film according to any of the preceding embodiments, wherein the second layer comprising zirconium nitride has a thickness of less than 4 nm.
111. The film according to any of the preceding embodiments, wherein the second layer comprising zirconium nitride has a thickness from 1 nm to 14 nm.
112. The film according to any of the preceding embodiments, wherein the second layer comprising zirconium nitride has a thickness from 1 nm to 13 nm.
113. The film according to any of the preceding embodiments, wherein the second layer comprising zirconium nitride has a thickness from 1 nm to 12 nm.
114. The film according to any of the preceding embodiments, wherein the second layer comprising zirconium nitride has a thickness from 1 nm to 11 nm.
115. The film according to any of the preceding embodiments, wherein the second layer comprising zirconium nitride has a thickness from 1 nm to 10 nm.
116. The film according to any of the preceding embodiments, wherein the second layer comprising zirconium nitride has a thickness from 1 nm to 9 nm.
117. The film according to any of the preceding embodiments, wherein the second layer comprising zirconium nitride has a thickness from 1 nm to 8 nm.
118. The film according to any of the preceding embodiments, wherein the second layer comprising zirconium nitride has a thickness from 1 nm to 7 nm.
119. The film according to any of the preceding embodiments, wherein the second layer comprising zirconium nitride has a thickness from 1 nm to 6 nm.
120. The film according to any of the preceding embodiments, wherein the thickness of the second layer comprising zirconium nitride is from 1 to 5 nm.
121. The film according to any of the preceding embodiments, wherein the thickness of the second layer comprising zirconium nitride is from 1 to 4 nm.
122. The film according to any of the preceding embodiments, wherein the thickness of the second layer comprising zirconium nitride is from 2 to 4 nm.
123. The film according to any of the preceding embodiments, wherein the thickness of the second layer comprising zirconium nitride is from 1 to 3 nm.
124. The film according to any of the preceding embodiments, wherein the thickness of the second layer comprising zirconium nitride is 3 nm.
125. The film according to any of the preceding embodiments, wherein the thickness of the second layer comprising zirconium nitride is less than 3 nm.
126. The film according to any of the preceding embodiments, wherein the substrate comprises a polyester.
127. The film according to any of the preceding embodiments, wherein the substrate comprises a polyethylene terephthalate polyester is coated with a primer.
128. The film according to any of the preceding embodiments, further comprising a layer comprising a pressure sensitive adhesive immediately adjacent to the substrate and further comprising a liner immediately adjacent to the layer comprising a pressure sensitive adhesive.
129. The film according to any of the preceding embodiments, further comprising one or more additives in one or more layers, wherein the additives are chosen from UV absorbers, dyes, anti-oxidants, and hydrolytic stabilizers.
130. The film according to any of the preceding embodiments, wherein the film is resistant to condensed water.
131. The film according to any of the preceding embodiments, wherein the film is resistant to dilute acetic acid.
132. The film according to any of the preceding embodiments, wherein the film is resistant to scratching by steel wool.
133. An article comprising the film according to any of the preceding embodiments.
134. An article comprising the film according to any of the preceding embodiments, wherein the article is a glazing unit.
135. A method of reducing emissivity in an article comprising applying the film according to any of the preceding embodiments to the article.
136. A method of reducing emissivity in an article comprising applying the film according to any of the preceding embodiments to the article; wherein the article is a glazing unit.
137. A low emissivity film comprising:
a first layer comprising zirconium nitride,
a metal layer,
a substrate layer for the metal layer comprising a compound chosen from zirconium nitride, aluminum zinc oxide (AZO), tin oxide (TO) and zinc tin oxide (ZTO) and
a substrate;
wherein the film has an emissivity of less than 0.2,
wherein the film has a visible reflectance of less than 25%; and
wherein the film has a visible transmission greater than 50%.
138. The low emissivity film according to any of the preceding embodiments directed to low emissivity films, further comprising a dielectric layer having an index of refraction greater than 1.6.
139. The low emissivity film according to any of the preceding embodiments directed to low emissivity films, further comprising a dielectric layer having an index of refraction greater than 1.7.
140. The low emissivity film according to any of the preceding embodiments directed to low emissivity films, further comprising a first layer comprising a silicon compound, wherein the silicon compound is chosen from silicon aluminum oxide, silicon aluminum oxynitride; silicon oxide, silicon oxynitride, silicon nitride, silicon aluminum nitride and combinations thereof.
141. The low emissivity film according to any of the preceding embodiments directed to low emissivity films, wherein the dielectric layer is a first layer comprising a silicon compound, wherein the silicon compound is chosen from silicon aluminum oxide, silicon aluminum oxynitride; silicon oxide, silicon oxynitride, silicon nitride, silicon aluminum nitride and combinations thereof 142. The low emissivity film according to any of the preceding embodiments directed to low emissivity films, further comprising a first radiation-cured acrylate layer.

143. The low emissivity film according to any of the preceding embodiments directed to low emissivity films, wherein the first layer comprising zirconium nitride has a thickness of less than 30 nm.

144. The low emissivity film according to any of the preceding embodiments directed to low emissivity films, wherein the first layer comprising zirconium nitride has a thickness of less than 25 nm.

145. The low emissivity film according to any of the preceding embodiments directed to low emissivity films, wherein the first layer comprising zirconium nitride has a thickness of less than 20 nm.

146. The low emissivity film according to any of the preceding embodiments directed to low emissivity films, wherein the first layer comprising zirconium nitride has a thickness of less than 15 nm.

147. The low emissivity film according to any of the preceding embodiments directed to low emissivity films, wherein the first layer comprising zirconium nitride has a thickness of less than 14 nm.

148. The low emissivity film according to any of the preceding embodiments directed to low emissivity films, wherein the first layer comprising zirconium nitride has a thickness of less than 13 nm.

149. The low emissivity film according to any of the preceding embodiments directed to low emissivity films, wherein the first layer comprising zirconium nitride has a thickness of less than 12 nm.

150. The low emissivity film according to any of the preceding embodiments directed to low emissivity films, wherein the first layer comprising zirconium nitride has a thickness of less than 11 nm.

151. The low emissivity film according to any of the preceding embodiments directed to low emissivity films, wherein the first layer comprising zirconium nitride has a thickness of less than 10 nm.

152. The low emissivity film according to any of the preceding embodiments directed to low emissivity films, wherein the first layer comprising zirconium nitride has a thickness of less than 9 nm.

153. The low emissivity film according to any of the preceding embodiments directed to low emissivity films, wherein the first layer comprising zirconium nitride has a thickness of less than 8 nm.

154. The low emissivity film according to any of the preceding embodiments directed to low emissivity films, wherein the first layer comprising zirconium nitride has a thickness of less than 7 nm.

155. The low emissivity film according to any of the preceding embodiments directed to low emissivity films, wherein the first layer comprising zirconium nitride has a thickness of less than 6 nm.

156. The low emissivity film according to any of the preceding embodiments directed to low emissivity films, wherein the first layer comprising zirconium nitride has a thickness of less than 5 nm.

157. The low emissivity film according to any of the preceding embodiments directed to low emissivity films, wherein the first layer comprising zirconium nitride has a thickness of less than 4 nm 158. The low emissivity film according to any of the preceding embodiments directed to low emissivity films, wherein the first layer comprising zirconium nitride has a thickness from 1 to 30 nm.

159. The low emissivity film according to any of the preceding embodiments directed to low emissivity films, wherein the first layer comprising zirconium nitride has a thickness from 1 to 25 nm.

160. The low emissivity film according to any of the preceding embodiments directed to low emissivity films, wherein the first layer comprising zirconium nitride has a thickness from 1 to 20 nm.

161. The low emissivity film according to any of the preceding embodiments directed to low emissivity films, wherein the first layer comprising zirconium nitride has a thickness from 1 to 15 nm.

162. The low emissivity film according to any of the preceding embodiments directed to low emissivity films, wherein the first layer comprising zirconium nitride has a thickness from 1 to 14 nm.

163. The low emissivity film according to any of the preceding embodiments directed to low emissivity films, wherein the first layer comprising zirconium nitride has a thickness from 1 to 13 nm.

164. The low emissivity film according to any of the preceding embodiments directed to low emissivity films, wherein the first layer comprising zirconium nitride has a thickness from 1 to 12 nm.

165. The low emissivity film according to any of the preceding embodiments directed to low emissivity films, wherein the first layer comprising zirconium nitride has a thickness from 1 to 11 nm.

166. The low emissivity film according to any of the preceding embodiments directed to low emissivity films, wherein the first layer comprising zirconium nitride has a thickness from 1 to 10 nm.

167. The low emissivity film according to any of the preceding embodiments directed to low emissivity films, wherein the first layer comprising zirconium nitride has a thickness from 1 to 9 nm.

168. The low emissivity film according to any of the preceding embodiments directed to low emissivity films, wherein the first layer comprising zirconium nitride has a thickness from 1 to 8 nm.

169. The low emissivity film according to any of the preceding embodiments directed to low emissivity films, wherein the first layer comprising zirconium nitride has a thickness from 1 to 7 nm.

170. The low emissivity film according to any of the preceding embodiments directed to low emissivity films, wherein the first layer comprising zirconium nitride has a thickness from 1 to 6 nm.

171. The low emissivity film according to any of the preceding embodiments directed to low emissivity films, wherein the substrate layer for the metal layer comprises zirconium nitride.

172. The low emissivity film according to any of the preceding embodiments directed to low emissivity films, wherein the substrate layer for the metal layer has a thickness of less than 30 nm.

173. The low emissivity film according to any of the preceding embodiments directed to low emissivity films, wherein the substrate layer for the metal layer has a thickness of less than 25 nm.

174. The low emissivity film according to any of the preceding embodiments directed to low emissivity films, wherein the substrate layer for the metal layer has a thickness of less than 20 nm.
175. The low emissivity film according to any of the preceding embodiments directed to low emissivity films, wherein the substrate layer for the metal layer has a thickness of less than 15 nm.
176. The low emissivity film according to any of the preceding embodiments directed to low emissivity films, wherein the substrate layer for the metal layer has a thickness of less than 14 nm.
177. The low emissivity film according to any of the preceding embodiments directed to low emissivity films, wherein the substrate layer for the metal layer has a thickness of less than 13 nm.
178. The low emissivity film according to any of the preceding embodiments directed to low emissivity films, wherein the substrate layer for the metal layer has a thickness of less than 12 nm.
179. The low emissivity film according to any of the preceding embodiments directed to low emissivity films, wherein the substrate layer for the metal layer has a thickness of less than 11 nm.
180. The low emissivity film according to any of the preceding embodiments directed to low emissivity films, wherein the substrate layer for the metal layer has a thickness of less than 10 nm.
181. The low emissivity film according to any of the preceding embodiments directed to low emissivity films, wherein the substrate layer for the metal layer has a thickness of less than 9 nm.
182. The low emissivity film according to any of the preceding embodiments directed to low emissivity films, wherein the substrate layer for the metal layer has a thickness of less than 8 nm.
183. The low emissivity film according to any of the preceding embodiments directed to low emissivity films, wherein the substrate layer for the metal layer has a thickness of less than 7 nm.
184. The low emissivity film according to any of the preceding embodiments directed to low emissivity films, wherein the substrate layer for the metal layer has a thickness of less than 6 nm.
185. The low emissivity film according to any of the preceding embodiments directed to low emissivity films, wherein the substrate layer for the metal layer has a thickness of less than 5 nm.
186. The low emissivity film according to any of the preceding embodiments directed to low emissivity films, wherein the substrate layer for the metal layer has a thickness of less than 4 nm
187. The low emissivity film according to any of the preceding embodiments directed to low emissivity films, wherein the substrate layer for the metal layer has a thickness from 1 to 30 nm.
188. The low emissivity film according to any of the preceding embodiments directed to low emissivity films, wherein the substrate layer for the metal layer has a thickness from 1 to 25 nm.
189. The low emissivity film according to any of the preceding embodiments directed to low emissivity films, wherein the substrate layer for the metal layer has a thickness from 1 to 20 nm.
190. The low emissivity film according to any of the preceding embodiments directed to low emissivity films, wherein the substrate layer for the metal layer has a thickness from 1 to 15 nm.
191. The low emissivity film according to any of the preceding embodiments directed to low emissivity films, wherein the substrate layer for the metal layer has a thickness from 1 to 14 nm.
192. The low emissivity film according to any of the preceding embodiments directed to low emissivity films, wherein the substrate layer for the metal layer has a thickness from 1 to 13 nm.
193. The low emissivity film according to any of the preceding embodiments directed to low emissivity films, wherein the substrate layer for the metal layer has a thickness from 1 to 12 nm.
194. The low emissivity film according to any of the preceding embodiments directed to low emissivity films, wherein the substrate layer for the metal layer has a thickness from 1 to 11 nm.
195. The low emissivity film according to any of the preceding embodiments directed to low emissivity films, wherein the substrate layer for the metal layer has a thickness from 1 to 10 nm.
196. The low emissivity film according to any of the preceding embodiments directed to low emissivity films, wherein the substrate layer for the metal layer has a thickness from 1 to 9 nm.
197. The low emissivity film according to any of the preceding embodiments directed to low emissivity films, wherein the substrate layer for the metal layer has a thickness from 1 to 8 nm.
198. The low emissivity film according to any of the preceding embodiments directed to low emissivity films, wherein the substrate layer for the metal layer has a thickness from 1 to 7 nm.
199. The low emissivity film according to any of the preceding embodiments directed to low emissivity films, wherein the substrate layer for the metal layer has a thickness from 1 to 6 nm.
200. The low emissivity film according to any of the preceding embodiments directed to low emissivity films, further comprising a second layer comprising a silicon compound, wherein the silicon compound is chosen from silicon aluminum oxide and silicon aluminum oxynitride, silicon oxide, silicon oxynitride silicon nitride, silicon aluminum nitride, and combinations thereof,
201. The low emissivity film according to any of the preceding embodiments directed to low emissivity films, further comprising a second-radiation-cured acrylate layer.
202. The film according to any of the preceding embodiments directed to low emissivity films, further comprising a protective layer comprising a radiation-cured acrylic polymer immediately adjacent the first layer comprising a silicon compound.
203. The film according to embodiment 202, wherein the protective layer comprising the third radiation-cured acrylic polymer further comprises silica nanoparticles having a diameter from 5 nm to 75 nm.
204. The film according to embodiment 202 or embodiment 203, wherein the third radiation-cured acrylic polymer comprises a fluoroacrylate polymer.
205. The film according to any of the preceding embodiments directed to low emissivity films, wherein the film is substantially color neutral in both transmission and reflection.
206. The film according to any of the preceding embodiments directed to low emissivity films, wherein the film has an emissivity of less than 0.16.

207. The film according to any of the preceding embodiments directed to low emissivity films, wherein the film has an emissivity of less than 0.12.
208. The film according to any of the preceding embodiments directed to low emissivity films, wherein the film has a visible reflectance of less than 20%.
209. The film according to any of the preceding embodiments directed to low emissivity films, wherein the film has a visible reflectance of less than 15%.
210. The film according to any of the preceding embodiments directed to low emissivity films, wherein the film has a visible transmission greater than 55%.
211. The film according to any of the preceding embodiments directed to low emissivity films, wherein the film has a visible transmission greater than 60%.
212. The film according to any of the preceding embodiments directed to low emissivity films, wherein the film has a visible transmission greater than 65%.
213. The film according to any of the preceding embodiments directed to low emissivity films, wherein the film has a visible transmission greater than 70%.
214. The film according to any of the preceding embodiments directed to low emissivity films, wherein the film has a visible transmission greater than 75%.
215. The film according to any of the preceding embodiments directed to low emissivity films, wherein the film has a visible transmission greater than 80%.
216. The film according to any of the preceding embodiments directed to low emissivity films, wherein the film further comprises a grey metal layer adjacent any layer in the film.
217. The film according to any of the preceding embodiments directed to low emissivity films, wherein the metal layer comprises one or more metallic component chosen from silver, gold, copper, nickel, iron, cobalt, zinc, and alloys of one or more metal chosen from gold, copper, nickel, iron, cobalt, and zinc.
218. The film according to any of the preceding embodiments directed to low emissivity films, wherein the metal layer comprises a silver-gold alloy.
219. The film according to any of the preceding embodiments directed to low emissivity films, wherein the metal layer comprises a silver alloy comprising at least 80% silver.
220. The film according to any of the preceding embodiments directed to low emissivity films, further comprising a first radiation-cured acrylate layer, wherein the first radiation-cured acrylate layer comprises an acid functionalized monomer.
221. The film according to any of the preceding embodiments directed to low emissivity films, further comprising a second radiation-cured acrylate layer, wherein the second radiation-cured acrylate layer comprises an acid functionalized monomer.
222. The film according to any of the preceding embodiments directed to low emissivity films, further comprising a first radiation-cured acrylate layer, wherein the first radiation-cured acrylate layer comprises more than one radiation-cured acrylate layer, and wherein each of the radiation-cured acrylate layers has a refractive index from 1.45 to 1.55.
223. The film according to any of the preceding embodiments directed to low emissivity films, further comprising a second radiation-cured acrylate layer, wherein the second radiation-cured acrylate layer comprises more than one radiation-cured acrylate layer, and wherein each of the radiation-cured acrylate layers has a refractive index from 1.45 to 1.55.
224. The film according to any of the preceding embodiments directed to low emissivity films, further comprising a first radiation-cured acrylate layer, wherein the first radiation-cured acrylate layer has a thickness from 20 nm to 100 nm.
225. The film according to any of the preceding embodiments directed to low emissivity films, further comprising a second radiation-cured acrylate layer, wherein the second radiation-cured acrylate layer has a thickness from 20 nm to 100 nm.
226. The film according to any of the preceding embodiments directed to low emissivity films, further comprising a second radiation-cured acrylate layer, wherein the second radiation-cured acrylate layer further comprises nanoparticles that absorb in the visible spectrum.
227. The film according to any of the preceding embodiments directed to low emissivity films, further comprising a second radiation-cured acrylate layer, wherein the second radiation cured acrylate layer further comprises nanoparticles, wherein the nanoparticles comprise nano-particles chosen from carbon, antimony tin oxide, indium tin oxide, tungsten tin oxide, and combinations thereof.
228. The film according to any of the preceding embodiments directed to low emissivity films, further comprising a second radiation-cured acrylate layer, wherein the second radiation-cured acrylate layer further comprises carbon nanoparticles.
229. The film according to any of the preceding embodiments directed to low emissivity films, further comprising a second radiation-cured acrylate layer, wherein the second radiation-cured acrylate layer further comprises nanoparticles that absorb in the near infrared spectrum.
230. The film according to any of the preceding embodiments directed to low emissivity films, further comprising a first radiation-cured acrylate layer, wherein the first radiation-cured acrylate layer is an actinic radiation-cured acrylate layer.
231. The film according to any of the preceding embodiments directed to low emissivity films, further comprising a second radiation-cured acrylate layer, wherein the second radiation-cured acrylate layer is an actinic radiation-cured acrylate layer.
232. The film according to embodiment 202 or embodiment 203, wherein the protective layer comprising the third radiation-cured acrylic polymer is an actinic radiation-cured acrylic polymer layer.
233. The film according to any of the preceding embodiments directed to low emissivity films, further comprising a first layer comprising a silicon compound, wherein the silicon compound in the first layer comprising a silicon compound is silicon aluminum oxynitride.
234. The film according to any of the preceding embodiments directed to low emissivity films, further comprising a first layer comprising a silicon compound, wherein the silicon compound in the first layer comprising a silicon compound is silicon aluminum oxynitride and the ratio of oxygen to nitrogen in the silicon aluminum oxynitride is from 0.1 to 1.
235. The film according to any of the preceding embodiments directed to low emissivity films, further comprising a first layer comprising a silicon compound, wherein the silicon compound in the first layer comprising a silicon compound is silicon aluminum oxynitride and the ratio of oxygen to nitrogen in the silicon aluminum oxynitride is from 0.3 to 0.5.
236. The film according to any of the preceding embodiments directed to low emissivity films, further comprising a first layer comprising a silicon compound, wherein the silicon compound in the first layer comprising a silicon compound is silicon aluminum oxynitride and the ratio of oxygen to nitrogen in the silicon aluminum oxynitride is 0.4
237. The film according to any of the preceding embodiments directed to low emissivity films, further comprising a second layer comprising a silicon compound, wherein the silicon compound in the second layer comprising a silicon compound is silicon aluminum oxynitride and the ratio of oxygen to nitrogen in the silicon aluminum oxynitride is from 0 to 0.5.
238. The film according to any of the preceding embodiments directed to low emissivity films, further comprising a second layer comprising a silicon compound, wherein the silicon compound in the second layer comprising a silicon compound is silicon aluminum oxynitride and the ratio of oxygen to nitrogen in the silicon aluminum oxynitride is from 0.3 to 0.5.
239. The film according to any of the preceding embodiments directed to low emissivity films, further comprising a second layer comprising a silicon compound, wherein the silicon compound in the second layer comprising a silicon compound is silicon aluminum oxynitride and the ratio of oxygen to nitrogen in the silicon aluminum oxynitride is 0.4.
240. The film according to any of the preceding embodiments directed to low emissivity films, further comprising a second layer comprising a silicon compound, wherein the silicon compound in the second layer comprising a silicon compound is silicon aluminum oxynitride.
241. The film according to any of the preceding embodiments directed to low emissivity films, further comprising a first layer comprising a silicon compound, wherein the first layer comprising a silicon compound comprises silicon oxide wherein the silicon to oxygen ratio is from 0.4 to 1.0.
242. The film according to any of the preceding embodiments directed to low emissivity films, further comprising a first layer comprising a silicon compound, wherein the first layer comprising a silicon compound comprises silicon oxide wherein the silicon to oxygen ratio is from 0.4 to 0.8.
243. The film according to any of the preceding embodiments directed to low emissivity films, further comprising a first layer comprising a silicon compound, wherein the first layer comprising a silicon compound comprises silicon oxide wherein the silicon to oxygen ratio is 0.5.
244. The film according to any of the preceding embodiments directed to low emissivity films, further comprising a second layer comprising a silicon compound, wherein the second layer comprising a silicon compound comprises silicon oxide wherein the silicon to oxygen ratio is from 0.4 to 1.0.
245. The film according to any of the preceding embodiments directed to low emissivity films, further comprising a second layer comprising a silicon compound, wherein the second layer comprising a silicon compound comprises silicon oxide wherein the silicon to oxygen ratio is from 0.4 to 0.8.
246. The film according to any of the preceding embodiments directed to low emissivity films, further comprising a second layer comprising a silicon compound, wherein the second layer comprising a silicon compound comprises silicon oxide wherein the silicon to oxygen ratio is 0.5.
247. The film according to any of the preceding embodiments directed to low emissivity films, further comprising a first layer comprising a silicon compound, wherein the first layer comprising a silicon compound comprises silicon aluminum oxide wherein the silicon to aluminum ratio is greater than 8.
248. The film according to any of the preceding embodiments directed to low emissivity films, further comprising a first layer comprising a silicon compound, wherein the first layer comprising a silicon compound comprises silicon aluminum oxide wherein the silicon to aluminum ratio is from 8 to 10.
249. The film according to any of the preceding embodiments directed to low emissivity films, further comprising a first layer comprising a silicon compound, wherein the first layer comprising a silicon compound comprises silicon aluminum oxide wherein the silicon to aluminum ratio is 9.
250. The film according to any of the preceding embodiments directed to low emissivity films, further comprising a second layer comprising a silicon compound, wherein the second layer comprising a silicon compound comprises silicon aluminum oxide wherein the silicon to aluminum ratio is greater than 8.
251. The film according to any of the preceding embodiments directed to low emissivity films, further comprising a second layer comprising a silicon compound, wherein the second layer comprising a silicon compound comprises silicon aluminum oxide wherein the silicon to aluminum ratio is from 8 to 10.
252. The film according to any of the preceding embodiments directed to low emissivity films, further comprising a second layer comprising a silicon compound, wherein the second layer comprising a silicon compound comprises silicon aluminum oxide wherein the silicon to aluminum ratio is 9.
253. The film according to any of the preceding embodiments directed to low emissivity films, further comprising a first layer comprising a silicon compound, wherein the first layer comprising a silicon compound has a thickness from 10 nm to 30 nm.
254. The film according to any of the preceding embodiments directed to low emissivity films, further comprising a first layer comprising a silicon compound, wherein the first layer comprising a silicon compound has a thickness from 20 nm to 30 nm.
255. The film according to any of the preceding embodiments directed to low emissivity films, further comprising a first layer comprising a silicon compound, wherein the first layer comprising a silicon compound has a thickness of 25 nm.
256. The film according to any of the preceding embodiments directed to low emissivity films, further comprising a second layer comprising a silicon compound, wherein the second layer comprising a silicon compound has a thickness from 10 nm to 30 nm.
257. The film according to any of the preceding embodiments directed to low emissivity films, further comprising a second layer comprising a silicon compound, wherein the second layer comprising a silicon compound has a thickness from 15 nm to 25 nm.
258. The film according to any of the preceding embodiments directed to low emissivity films, further comprising a second layer comprising a silicon compound, wherein the second layer comprising a silicon compound has a thickness of 20 nm.

259. The film according to any of the preceding embodiments directed to low emissivity films, further comprising either a first or a second layer comprising a silicon compound, wherein the silicon compound in either the first or second layer comprising a silicon compound is surface modified to impart hydrophobicity.

260. The film according to any of the preceding embodiments directed to low emissivity films, further comprising either a first or a second layer comprising a silicon compound, wherein the silicon compound in either the first or second layer comprising a silicon compound is surface modified to impart hydrophilicity.

261. The film according to any of the preceding embodiments directed to low emissivity films, further comprising either a first or a second layer comprising a silicon compound, wherein the silicon compound in either the first or second layer comprising a silicon compound comprises a fluorosilane coating.

262. The film according to any of the preceding embodiments directed to low emissivity films, further comprising either a first or a second layer comprising a silicon compound, wherein the silicon compound in either the first or second layer comprising a silicon compound comprises an acid functionalized coating.

263. The film according to any of the preceding embodiments directed to low emissivity films, wherein the first layer comprising zirconium nitride further comprises oxygen.

264. The film according to any of the preceding embodiments directed to low emissivity films, wherein the first layer comprising zirconium nitride further comprises oxygen and the ratio of oxygen to nitrogen in the zirconium oxynitride is from 0 to 1.

265. The film according to any of the preceding embodiments directed to low emissivity films, further comprising a second layer comprising zirconium nitride, wherein the second layer comprising zirconium nitride further comprises oxygen.

266. The film according to any of the preceding embodiments directed to low emissivity films, further comprising a second layer comprising zirconium nitride, wherein the second layer comprising zirconium nitride further comprises oxygen and the ratio of oxygen to nitrogen in the zirconium oxynitride is from 0 to 1.

267. The film according to any of the preceding embodiments directed to low emissivity films, wherein the thickness of the first layer comprising zirconium nitride is from 1 to 5 nm.

268. The film according to any of the preceding embodiments directed to low emissivity films, wherein the thickness of the first layer comprising zirconium nitride is from 1 to 4 nm.

269. The film according to any of the preceding embodiments directed to low emissivity films, wherein the thickness of the first layer comprising zirconium nitride is from 2 to 4 nm.

270. The film according to any of the preceding embodiments directed to low emissivity films, wherein the thickness of the first layer comprising zirconium nitride is from 1 to 3 nm.

271. The film according to any of the preceding embodiments directed to low emissivity films, wherein the thickness of the first layer comprising zirconium nitride is 3 nm.

272. The film according to any of the preceding embodiments directed to low emissivity films, wherein the thickness of the first layer comprising zirconium nitride is less than 3 nm.

273. The film according to any of the preceding embodiments directed to low emissivity films, wherein the thickness of the substrate layer for the metal layer is from 1 to 5 nm.

274. The film according to any of the preceding embodiments directed to low emissivity films, wherein the thickness of the substrate layer for the metal layer is from 1 to 4 nm.

275. The film according to any of the preceding embodiments directed to low emissivity films, wherein the thickness of the substrate layer for the metal layer is from 2 to 4 nm.

276. The film according to any of the preceding embodiments directed to low emissivity films, wherein the thickness of the substrate layer for the metal layer is from 1 to 3 nm.

277. The film according to any of the preceding embodiments directed to low emissivity films, wherein the thickness of the substrate layer for the metal layer is 3 nm.

278. The film according to any of the preceding embodiments directed to low emissivity films, wherein the thickness of the substrate layer for the metal layer is less than 3 nm.

279. The film according to any of the preceding embodiments directed to low emissivity films, wherein the substrate comprises a polyester.

280. The film according to any of the preceding embodiments directed to low emissivity films, wherein the substrate comprises a polyethylene terephthalate polyester.

281. The film according to any of the preceding embodiments directed to low emissivity films, further comprising a layer comprising a pressure sensitive adhesive immediately adjacent to the substrate and further comprising a liner immediately adjacent to the layer comprising a pressure sensitive adhesive.

282. The film according to any of the preceding embodiments directed to low emissivity films, further comprising one or more additives in one or more layers, wherein the additives are chosen from UV absorbers, dyes, antioxidants, and hydrolytic stabilizer.

283. The film according to any of the preceding embodiments directed to low emissivity films, wherein the film is resistant to condensed water.

284. The film according to any of the preceding embodiments directed to low emissivity films, wherein the film is resistant to dilute acetic acid.

285. The film according to any of the preceding embodiments directed to low emissivity films, wherein the film is resistant to scratching by steel wool.

286. An article comprising the film according to any of the preceding embodiments directed to low emissivity films.

287. An article comprising the film according to any of the preceding embodiments directed to low emissivity films, wherein the article is a glazing unit.

288. A method of reducing emissivity in an article comprising applying the film according to any of the preceding embodiments directed to low emissivity films to the article.

289. A method of reducing emissivity in an article comprising applying the film according to any of the preceding embodiments directed to low emissivity films to the article; wherein the article is a glazing unit.

We claim:

1. A film consisting essentially of the following layers in the recited order:
   a first layer comprising a silicon compound, wherein the silicon compound is chosen from silicon aluminum oxide, silicon aluminum oxynitride, silicon oxide, silicon oxynitride, silicon nitride, silicon aluminum nitride, and combinations thereof,
   a first radiation-cured acrylate layer;
   a first layer comprising zirconium nitride, wherein the layer has a thickness from 1 to 15 nm;
   a metal layer,
   a second layer comprising zirconium nitride, wherein the layer has a thickness from 1 to 15 nm;
   a second layer comprising a silicon compound, wherein the silicon compound is chosen from silicon aluminum oxide and silicon aluminum oxynitride, silicon oxide, silicon oxynitride, silicon nitride, silicon aluminum nitride, and combinations thereof,
   a second radiation-cured acrylate layer;
   a substrate;
   wherein the film has an emissivity of less than 0.2,
   wherein the film has a visible reflectance of less than 25%; and
   wherein the film has a visible transmission greater than 50%; and
   a protective layer comprising a third radiation-cured acrylic polymer immediately adjacent the first layer comprising a silicon compound.

2. The film according to claim 1, wherein the protective layer comprising the third radiation-cured acrylic polymer further comprises silica nanoparticles having a diameter from 5 nm to 75 nm.

3. The film according to claim 1, wherein the third radiation-cured acrylic polymer comprises a fluoroacrylate polymer.

4. The film according to claim 1, wherein the film is substantially color neutral in both transmission and reflection as defined by CIELAB color values.

5. The film according to claim 1, wherein the metal layer comprises one or more metallic component chosen from silver, gold, copper, nickel, iron, cobalt, zinc, and alloys of one or more metal chosen from gold, copper, nickel, iron, cobalt, and zinc.

6. The film according to claim 1, wherein the metal layer comprises a silver-gold alloy.

7. The film according to claim 1, wherein the first layer comprising zirconium nitride has a thickness from 1 nm to 14 nm.

8. The film according to claim 1, wherein the second layer comprising zirconium nitride has a thickness from 1 nm to 14 nm.

9. The film according to claim 1, wherein the film is resistant to condensed water.

10. The film according to claim 1, wherein the film is resistant to dilute acetic acid.

11. An article comprising the film according to claim 1.

12. An article comprising the film according to claim 1, wherein the article is a glazing unit.

13. A method of reducing emissivity in an article comprising applying the film according to claim 1 to the article.

* * * * *